US012713672B2

(12) United States Patent
Sung et al.

(10) Patent No.: US 12,713,672 B2
(45) Date of Patent: Aug. 18, 2026

(54) METAL OXIDE SEMICONDUCTOR FIELD EFFECT TRANSISTORS (MOSFET) INCLUDING DEEP P-WELLS AND METHODS OF FORMING SAME

(71) Applicant: THE RESEARCH FOUNDATION FOR THE STATE UNIVERSTIY OF NEW YORK, Albany, NY (US)

(72) Inventors: Woongje Sung, Niskayuna, NY (US); Dongyoung Kim, Albany, NY (US); Adam Morgan, Newtonville, NY (US)

(73) Assignee: THE RESEARCH FOUNDATION FOR THE STATE UNIVERSITY OF NEW YORK, Albany, NY (US)

( * ) Notice: Subject to any disclaimer, the term of this patent is extended or adjusted under 35 U.S.C. 154(b) by 298 days.

(21) Appl. No.: 18/546,853

(22) PCT Filed: Feb. 18, 2022

(86) PCT No.: PCT/US2022/016976
§ 371 (c)(1),
(2) Date: Aug. 17, 2023

(87) PCT Pub. No.: WO2022/178252
PCT Pub. Date: Aug. 25, 2022

(65) Prior Publication Data

US 2024/0128323 A1 Apr. 18, 2024

Related U.S. Application Data

(60) Provisional application No. 63/152,108, filed on Feb. 22, 2021.

(51) Int. Cl.
*H10D 62/10* (2025.01)
*H10D 30/01* (2025.01)
(Continued)

(52) U.S. Cl.
CPC ....... *H10D 62/393* (2025.01); *H10D 30/0291* (2025.01); *H10D 30/615* (2025.01);
(Continued)

(58) Field of Classification Search
CPC ........... H10D 30/0291; H10D 30/0293; H10D 30/0295; H10D 30/0297; H10D 30/66;
(Continued)

(56) References Cited

U.S. PATENT DOCUMENTS

2008/0185593 A1* 8/2008 Saggio ............... H10D 30/0291 257/E21.409
2010/0032685 A1* 2/2010 Zhang ................. H10D 30/668 257/493

(Continued)

OTHER PUBLICATIONS

International Search Report and Written Opinion of PCT/US2022/016976 mailed Jun. 1, 2022, 10 pages.

*Primary Examiner* — Eric A. Ward
(74) *Attorney, Agent, or Firm* — Heslin Rothenberg Farley & Mesiti P.C.; George S. Blasiak, Esq.

(57) ABSTRACT

Metal oxide semiconductor field effect transistors (MOSFET) including deep P-wells are disclosed. MOSFETs may include a drift layer disposed over a substrate, and a P-well disposed within the drift layer. The P-well may include a first portion disposed directly over the drift layer, where the first portion includes a first doping concentration. The P-well may also include a second portion separated from the drift layer by the first portion. The second portion may include a second doping concentration distinct from the first doping concentration of the first portion. Additionally, the MOSFET may include an N-source disposed at least partially over the second portion of the P-well, an oxide layer disposed over the N-source and the drift layer, and a gate layer disposed over the oxide layer.

20 Claims, 22 Drawing Sheets

(51) Int. Cl.
*H10D 30/60* (2025.01)
*H10D 30/66* (2025.01)
*H10D 62/17* (2025.01)
*H10P 30/20* (2026.01)

(52) U.S. Cl.
CPC ........... *H10D 30/66* (2025.01); *H10D 62/102* (2025.01); *H10P 30/2042* (2026.01); *H10P 30/222* (2026.01)

(58) Field of Classification Search
CPC .. H10D 30/662; H10D 30/663; H10D 30/664; H10D 30/665; H10D 30/667; H10D 30/668; H10D 30/669; H10D 62/393
See application file for complete search history.

(56) References Cited

U.S. PATENT DOCUMENTS

2010/0032885 A1 2/2010 Xu
2010/0200931 A1* 8/2010 Matocha .............. H10D 62/393 257/E21.409
2014/0021590 A1* 1/2014 Schulze ................. H10D 30/66 257/E21.04
2015/0041884 A1* 2/2015 Song .................... H10D 62/111 257/329
2017/0345891 A1* 11/2017 Van Brunt ........... H10D 62/106
2018/0069083 A1* 3/2018 Suvorov .............. H10D 62/106
2020/0020793 A1 1/2020 Ryu

* cited by examiner

METAL OXIDE SEMICONDUCTOR FIELD EFFECT TRANSISTORS (MOSFET) INCLUDING DEEP P-WELLS AND METHODS OF FORMING SAME

CROSS-REFERENCE TO RELATED APPLICATIONS

This application is a national stage filing under section 371 of International Application No. PCT/US2022/016976 filed on Feb. 18, 2022, and published on Aug. 25, 2022, as WO2022/178252A1 and claims priority to U.S. provisional application No. 63/152,108 filed on Feb. 22, 2021, the content of which U.S. provisional application No. 63/152,108 is hereby incorporated by reference into the present application. WO2022/178252A1 is hereby incorporated by reference into the present application.

GOVERNMENT RIGHTS

This invention was made with government support under Grant No. DE-EE0008710 awarded by the U.S. Department of Energy. The government has certain rights in the invention.

FIELD OF THE INVENTION

The disclosure relates generally to semiconductor devices, and more particularly, to Metal Oxide Semiconductor Field Effect Transistors (MOSFET) including deep P-wells and methods of forming the same.

BACKGROUND

In the MOSFET industry, there is a continuous need for improved MOSFET structures that result in the reduction of on-resistance, leakage, as well as the reduction of electric field at the gate region. Furthermore, there is an ongoing need for improved reliability and short circuit capability among MOSFET devices. What is needed is an improved MOSFET structure containing deep P-wells. The present disclosure now provides MOSFET structures that overcome challenges relating to on-resistance, breakdown voltage, leakage current, electric field at the oxide, threshold voltage, and short circuit capability.

SUMMARY

A first aspect of the disclosure provides a field effect transistor, including: a substrate; a drift layer disposed over the substrate; a P-well disposed within the drift layer, the P-well including: a first portion disposed directly over the drift layer, the first portion having at least one distinct area, each of the at least one distinct areas further comprising a respective doping concentration, and a second portion separated from the drift layer by the first portion, the second portion including a second doping concentration distinct from the respective doping concentration of the at least one distinct areas of the first portion; an N-source disposed at least partially over the second portion of the P-well; an oxide layer disposed over the N-source and the drift layer; and a gate layer disposed over the oxide layer.

A second aspect of the disclosure provides a method of forming a field effect transistor. The method including: disposing a drift layer over a substrate; doping a portion of the drift layer to form a p-well within drift layer, the P-well including: a first portion disposed directly over the drift layer, the first portion having at least one distinct area, each of the at least one distinct areas having distinct doping concentrations, and a second portion separated from the drift layer by the first portion, the second portion including a second doping concentration distinct from the doping concentrations for each of the distinct areas of the first portion; doping a portion of the second portion of the P-well to form an N-source; disposing oxide an oxide layer over the N-source and the drift layer; and disposing a gate layer over the oxide layer.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

As an initial matter, in order to clearly describe the current disclosure it will become necessary to select certain terminology when referring to and describing relevant components within the disclosure. When doing this, if possible, common industry terminology will be used and employed in a manner consistent with its accepted meaning. Unless otherwise stated, such terminology should be given a broad interpretation consistent with the context of the present application and the scope of the appended claims. Those of ordinary skill in the art will appreciate that often a particular component may be referred to using several different or overlapping terms. What may be described herein as being a single part may include and be referenced in another context as consisting of multiple components. Alternatively, what may be described herein as including multiple components may be referred to elsewhere as a single part.

As discussed herein, the disclosure relates generally to semiconductor devices, and more particularly, to Metal Oxide Semiconductor Field Effect Transistors (MOSFET) including deep P-wells and methods of forming the same.

These and other embodiments are discussed below with reference to FIGS. 1-22. However, those skilled in the art will readily appreciate that the detailed description given herein with respect to these Figures is for explanatory purposes only and should not be construed as limiting.

Figure 1:
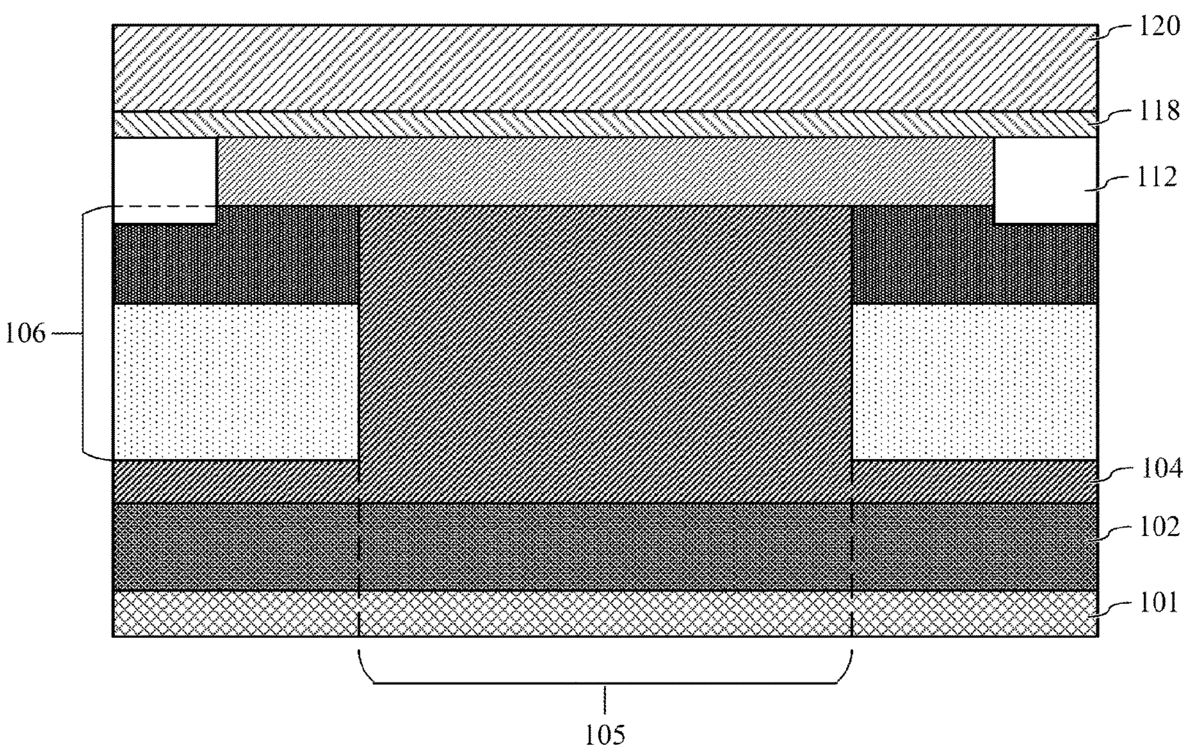
FIG. 1 shows a cross-sectional view of a Metal Oxide Semiconductor Field Effect Transistors (MOSFET), according to embodiments of the disclosure.
Figure 2:
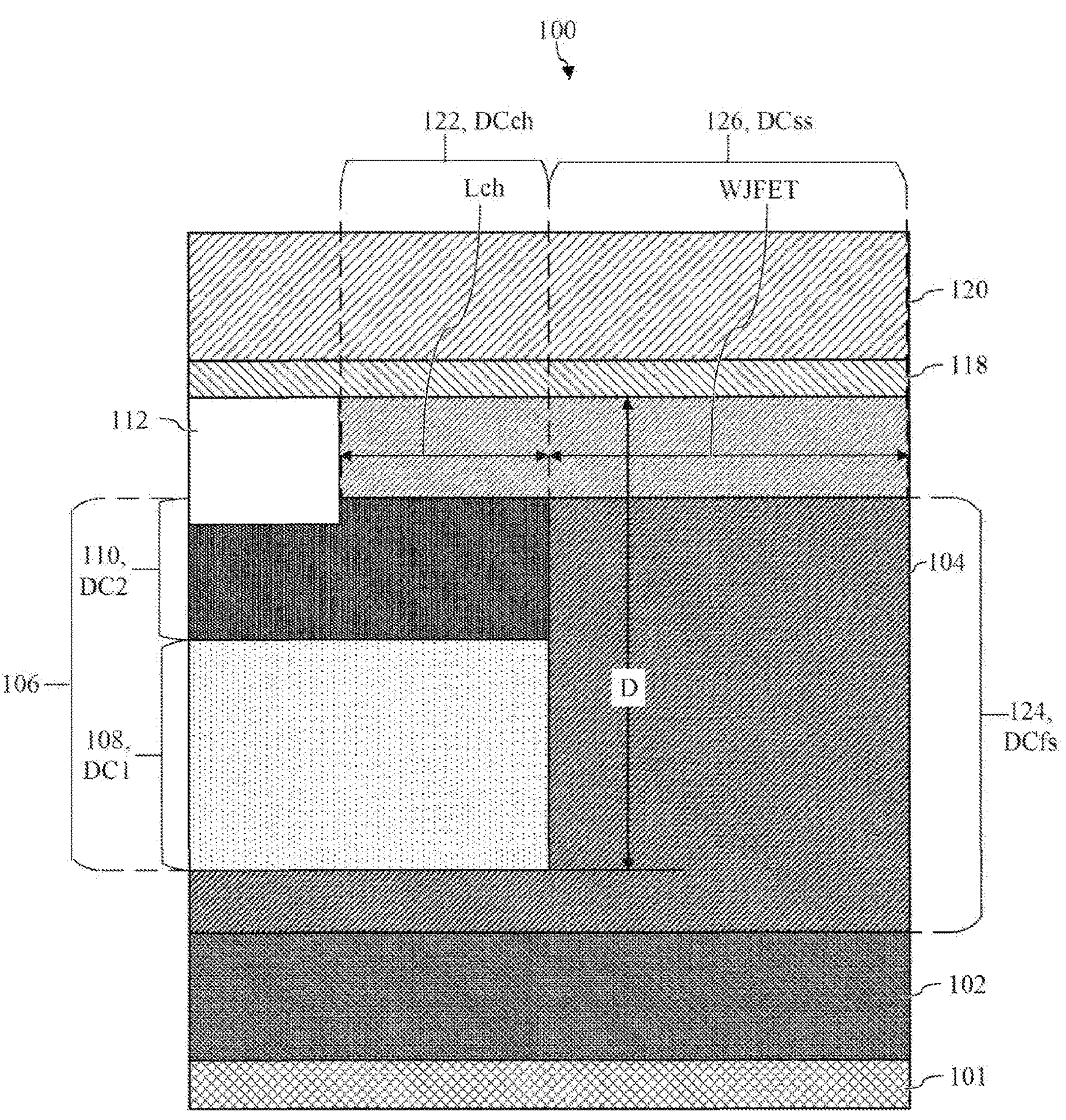
FIG. 2 shows an enlarged cross-sectional view of a portion of the MOSFET of FIG. 1, according to embodiments of the disclosure.

FIGS. 1 and 2 show cross-sectional views of a portion or section of a semiconductor device. More specifically, FIG. 1 shows a cross-sectional front view of a Metal Oxide Semiconductor Field Effect Transistors (MOSFET) 100 and FIG. 2 shows an enlarged cross-sectional view of a portion of MOSFET 100 of FIG. 1. MOSFET 100 shown in FIG. 1 may be a silicone carbide (SiC) MOSFET, or any other suitable MOSFET that may implement the structured described herein.

As shown in FIGS. 1 and 2, MOSFET 100 may include a substrate 102. The substrate may include or form a base layer of MOSFET 100 that may be formed as a semiconducting material and/or may be formed from any suitable material or material composition that includes semiconducting properties/characteristic. For example, substrate may be formed from indium phosphide (InP) or Indium gallium arsenide (InGaAs). In other non-limiting examples substrate can include without limitation, substances consisting essentially of one or more compound semiconductors. Substrate can be provided as a bulk substrate or as part of a silicon-on-insulator (SOI) wafer. Additionally, or alternatively, substrate may be formed from, for example, silicon (Si), silicon carbide (SiC), germanium (Ge), germanium oxide (GeO), cadmium zinc telluride (CdZnTe), gallium nitride (GaN), or gallium arsenide (GaAs). Furthermore, substrate layer may be fabricated as a layer of semiconductor material, substances or materials consisting essentially of one or more compound semiconductors having a composition defined by the formula AlX1GaX2InX3AsY1PY2NY3SbY4, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substances can include II-VI compound semiconductors having a composition ZnA1CdA2SeB1TeB2, where A1, A2, B1, and B2 are relative proportions each greater than or equal to zero and A1+A2+B1+B2=1 (1 being a total mole quantity).

MOSFET 100 shown in FIGS. 1 and 2 may include a drain contact 101. Drain contact 101 may be formed beneath substrate 102. More specifically, drain contact 101 may be disposed, formed, positioned under, and/or directly contact substrate 102. Drain contact 101 may be formed from a metal, such as aluminum (Al), tungsten (W), copper (Cu), cobalt (Co), or any other suitable material.

MOSFET 100 shown in FIGS. 1 and 2 may include a drift layer 104. Drift layer 104 may be disposed over substrate 102. More specifically, drift layer 104 may be disposed, formed, positioned over, and/or directly contact substrate 102. Drift layer 104 may be included within MOSFET 100 to substantially block high voltages and/or prevent leakage from other device layers of MOSFET 100 during operation, as discussed herein. As discussed herein, drift layer 104 may include and/or define a junction gate field effect transistor (JFET) region 105 within MOSFET 100. JFET region 105 of drift layer 104 may be positioned, located, and/or formed between distinct portions, components, and/or devices of MOSFET 100, as discussed herein. JFET region 105 may provide resistance within MOSTFET 100 and/or may prevent leakage during operation. Drift layer 104 may be formed from any suitable material or material composition that may prevent leakage and/or provide resistive properties/characteristics. For example, drift layer 104 may be formed from silicon carbine (SiC), Galium nitride (GaN), gallium (III) oxide ($Ga_2O_3$), aluminum nitride (AlN), and/or any other suitable semiconductor material (e.g., wide bandgap materials). As discussed herein, portions of drift layer 104/JFET region 105 may be doped to include a predetermined concentration.

MOSFET 100 shown in FIGS. 1 and 2 may also include a P-well 106. P-well 106 may be disposed within drift layer 104. More specifically, P-well 106 may be formed directly within and/or may extend partially through drift layer 104. In the non-limiting example, and as shown in FIG. 1, two distinct P-wells 106 may be formed and/or positioned on either side of JFET region 105 of drift layer 104. P-well 106 of MOSFET 100 may be substantially conductive and may carry, receive, and/or flow an electrical current to distinct portions, components, and/or devices of MOSFET 100, as discussed herein. As such, P-well 106 may be formed from any suitable material or composition of material that may include substantially conductive properties/characteristics. For example, and as discussed herein, P-well 106 may be formed by doping materials formed within MOSFET 100 (e.g., drift layer 104) via ion implantation.

In the non-limiting example shown in FIGS. 1 and 2, P-well 106 may include two distinct portions. More specifically, and with reference to FIG. 2, P-well 106 of MOSFET 100 may include a first portion 108 and a second portion 110. First portion 108 may be disposed directly over drift layer 104. More specifically, first portion 108 of P-well 106 may be formed, disposed, and/or positioned over a portion or section of drift layer 104. The section of drift layer 104 may be positioned between and/or may separate first portion 108 of P-well 106 and substrate 102. First portion 108 of P-well 106 may also be formed, disposed, and/or positioned adjacent JFET region 105 of drift layer 104. First portion 108 of P-well 106 may include a first doping concentration (DC1). That is, and as discussed herein, first portion 108 of P-well 106 may be formed by performing a doping process or technique, for example ion implantation, on a portion of drift layer 104. First portion 108 may be formed by doping drift layer 104 with a first or predetermined ion concentration under first or predetermined operational parameters. The ion concentration and/or operational parameters may determine characteristics of first portion 108. For example, and as shown in FIG. 2, first portion 108 of P-well 106 may extend into drift layer 104 a predetermined depth (D) from an oxide layer of MOSFET 100. The predetermined depth (D) may be between approximately 1.0 micron (μm) and approximately 2.5 μm. Additionally, and in a non-limiting example, the first doping concentration of first portion 108 is between approximately $1.0\times10^{17}$ atoms per cubic cm (atoms/$cm^3$) and approximately $4.0\times10^{17}$ atoms/$cm^3$.

Second portion 110 of P-well 106 may be disposed directly over first portion 108. More specifically, second portion 110 of P-well 106 may be formed, disposed, and/or positioned directly over first portion 108. Additionally, and as shown in FIG. 2, second portion 110 may be separated from drift layer 104 by first portion 108. Similar to first portion 108, second portion 110 of P-well 106 may also be formed, disposed, and/or positioned adjacent JFET region 105 of drift layer 104. Second portion 110 of P-well 106 may include a second doping concentration (DC2). Second doping concentration (DC2) may be distinct from first doping concentration (DC1) of first portion 108. For example, the first doping concentration (DC1) of first portion 108 may be less than the second doping concentration (DC2) of second portion 110. As discussed herein, second portion 110 of P-well 106 may be formed by performing a doping process or technique, for example ion implantation, on a portion of drift layer 104. Second portion 110 may be formed by doping a portion of drift layer 104 formed above first portion 108 with a second or predetermined ion concentration under second or predetermined operational parameters. The ion concentration and/or operational parameters may determine characteristics of second portion 110. In a non-limiting example, the second doping concentration of second portion 110 is between approximately $1.0\times10^{18}$ atoms per cubic cm (atoms/$cm^3$) and approximately $1.5\times10^{19}$ atoms/$cm^3$.

MOSFET 100 may also include an N-source 112. N-source 112 may be disposed at least partially over P-well 106 of MOSFET 100. More specifically, and as shown in the non-limiting example of FIGS. 1 and 2, N-source 112 may be disposed at least partially over and/or at least partially within a portion of second portion 110 of P-well 106. N-source 112 of MOSFET 100 may be substantially conductive and may carry, receive, and/or flow an electrical current within MOSFET 100, as discussed herein. As such, N-source 112 may be formed from any suitable material or composition of material that may include substantially conductive properties/characteristics. For example, and similar to P-well portion 106, N-source 112 may be formed using a doping technique (e.g., ion implantation) on the materials formed within MOSFET 100 (e.g., drift layer 104).

An oxide layer 118 may be formed over various portions, components, and/or devices of MOSFET 100. More specifically, and as shown in FIGS. 1 and 2, oxide layer 118 of MOSFET 100 may be disposed directly over, positioned on, contact, and/or substantially cover (exposed portions of) N-source 112, and drift layer 104, respectively. Oxide layer 118 may insulate various portions, components, and/or devices of MOSFET 100, and as a result may be formed from any suitable material or material composition that includes insulative properties/characteristics. For example, oxide layer 118 may be formed as a bulk silicon insulator or can be composed of an oxide substance. Additionally, materials appropriate for the composition of oxide layer 118 may include, for example, silicon dioxide (SiO2), silicon nitride (SiN), hafnium oxide (HfO2), alumina (Al2O3), yttrium oxide (Y2O3), tantalum oxide (Ta2O5), titanium dioxide (TiO2), praseodymium oxide (Pr2O3), zirconium oxide (ZrO2), erbium oxide (ErOx), (Al2O3), (Si3N4), (2D h-BN), ionic liquids, electric double layers, and other currently known or later developed materials having similar properties.

MOSFET 100 shown in FIGS. 1 and 2 may also include a gate layer 120. Gate layer 120 may be disposed over oxide layer 118. More specifically, gate layer 120 may be disposed, formed, positioned over, and/or directly contact oxide layer 118 of MOSFET 100. Gate layer 120 may be formed from any suitable material having conductive properties/characteristics. For example, gate layer 120 may be formed from materials including, but not limited to, N-type/P-type polysilicons, copper (Cu), aluminum (Al), platinum (Pt), tungsten (W), and other metals or metal-based materials.

Turning to FIG. 2, drift layer 104 of MOSFET 100 may also include distinct regions and/or portions. For example, drift layer 104 of MOSFET 100 may include a channel region 122. In the non-limiting example shown in FIG. 2, channel region 122 is formed as an accumulation channel or mode. That is, channel region 122 may be formed between the second portion 110 of P-well 106 and oxide layer 118. Additionally, and as shown in FIG. 2, channel region 122 may also be positioned directly adjacent N-source 112 of MOSFET 100. Channel region 122 may include a predetermined length (Lch) that represents the size or dimension of the channel for MOSFET 100. That is, the predetermined length (Lch) of channel region 122 may represent the length of the channel and/or the length of P-well 106 extending beyond N-source 112 and/or extending toward JEFT region 105 of drift layer 104 in MOSFET 100. In a non-limiting example, channel region 122 may include a predetermined length (Lch) between approximately 0.2 micron (μm) and approximately 2.0 μm.

Although shown as an accumulation channel or mode herein, it is understood that channel region 122 may also be configured and/or formed as an inversion channel or mode. That is, in other non-limiting examples (not shown), channel region 122 may include P-well 106 positioned or extending substantially adjacent to and/or contacting oxide layer 118.

Channel region 122 of drift layer 104 may include a predetermined doping concentration (DCch). That is, and as discussed herein, channel region 122 may be formed by performing a doping process or technique, for example ion implantation, on a portion of drift layer 104. In a non-limiting example, the predetermined doping concentration of channel region 122 may be between approximately $1.0\times10^{16}$ atoms/$cm^3$ and approximately $9.0\times10^{16}$ atoms/$cm^3$.

As shown in FIGS. 1 and 2, JFET region 105 of drift layer 104 may be formed, positioned, and/or disposed adjacent P-well and channel region 122. In a non-limiting example, JFET region 105 may include a first section 124 formed directly adjacent P-well 106, and second section 126 formed directly adjacent channel region 122. First section 124 of JFET region 105 may extend between second section 126 and substrate 102. Second section 126 may be positioned between oxide layer 118 and first section 124 of JFET region 105. Second section 126 may include a predetermined width (WJEFT) that represents the size or dimension of JFET region 105 for MOSFET 100. In a non-limiting example, second section 126 (and JFET region 105) may include a predetermined width (WJFET) between approximately 0.2 micron (μm) and approximately 5.0 μm.

As discussed herein, drift layer 104 of MOSFET 100 may also be doped and/or may include a doping concentration. More specifically, and similar to channel region 122, first section 124 and second section 126 of JFET region 105 for drift layer 104 may include predetermined doping concentrations (DCfs, DCss). The second doping concentration (DCss) of second section 126 may be distinct from the first doping concentration (DCfs) of first section 124 of MOSFET 100. In a non-limiting example, first section 124 and second section 126 of JFET region 105 may include a doping concentration (DCfs, DCss) between approximately $1.0\times10^{16}$ atoms/$cm^3$ and approximately $3.0\times10^{17}$ atoms/$cm^3$, where the doping concentration (DCfs) for the first section 124 is greater than the doping concentration (DCss) for the second section 126. In another non-limiting example, doping concentration (DCfs) for the first section 124 is less than the doping concentration (DCss) for the second section 126. In yet another non-limiting example, doping concentration (DCfs) for the first section 124 may be substantially equal to the doping concentration (DCss) for the second section 126.

Figure 3:
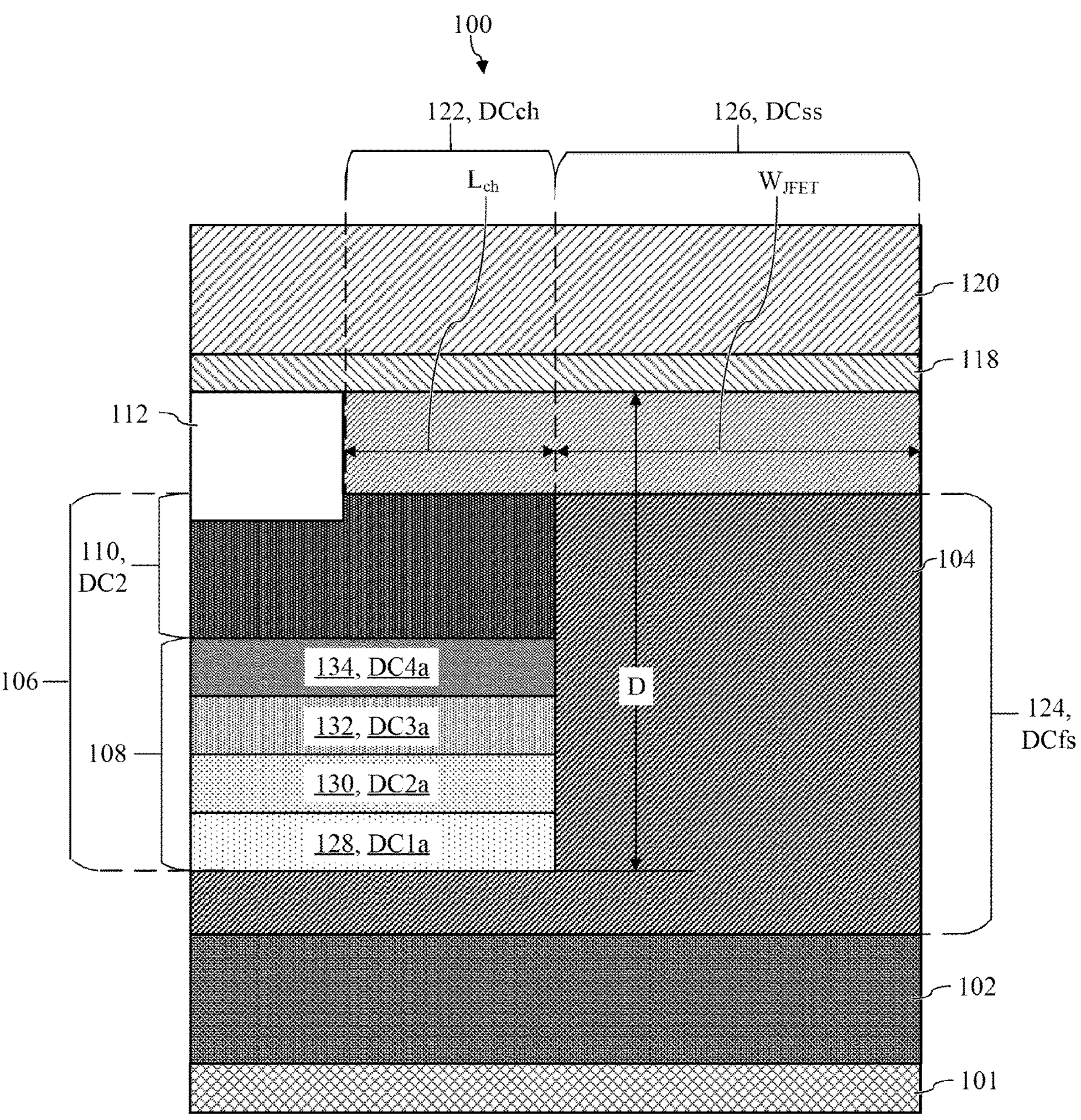
FIG. 3 shows a cross-sectional view of a portion of a MOSFET, according to additional embodiments of the disclosure.
Figure 4:
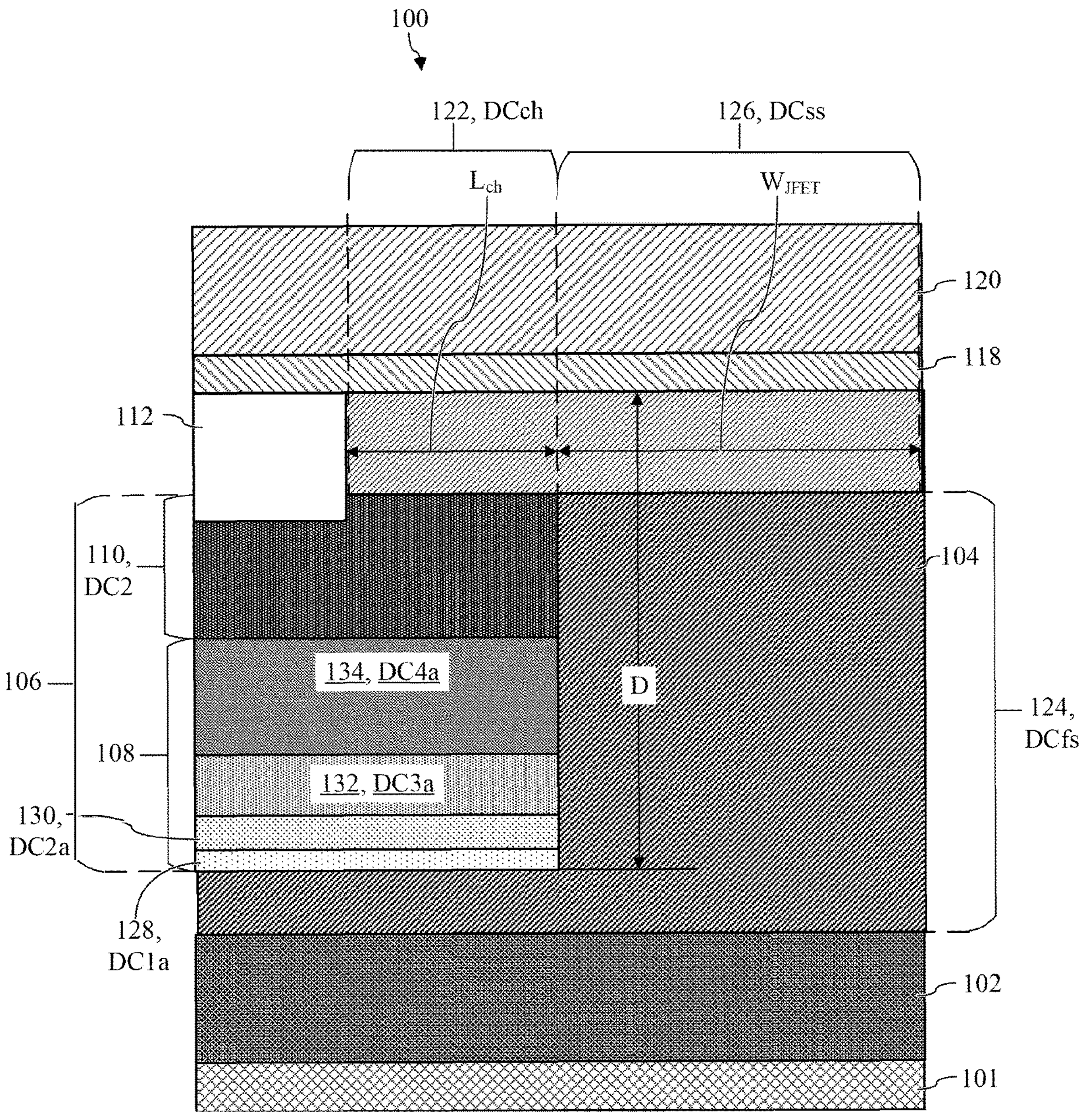
FIG. 4 shows a cross-sectional view of a portion of a MOSFET, according to another embodiment of the disclosure.

Turning to FIGS. 3 and 4, other non-limiting examples of MOSFET 100 are shown. More specifically, FIGS. 3 and 4 show a cross-sectional view of a portion of MOSFET 100, similar to the non-limiting example shown in FIG. 2. MOSFET 100 may include similar portions, components, and/or devices as those shown and discussed herein with respect to MOSFET 100 shown in FIGS. 1 and 2. For example, MOSFET 100 may include drift layer 104, P-well 106, N-source 112, oxide layer 118, and gate layer 120. It is understood that similarly numbered and/or named components may function in a substantially similar fashion. Redundant explanation of these components has been omitted for clarity.

Distinct from the non-limiting example of MOSFET 100 shown and discussed herein with respect to FIGS. 1 and 2, P-well 106 of MOSFET 100 shown in FIGS. 3 and 4 may include additional features, components, and/or portions. For example, first portion 108 of P-well 106 may include a plurality of distinct areas 128, 130, 132, 134. That is, first portion 108 of P-well 106 may not include a single portion, but rather may include a plurality (e.g., four) distinct areas 128, 130, 132, 134 formed integrally therein. As shown in FIGS. 3 and 4, first area 128 may be positioned between second portion 110 and drift layer 104, and second area 130 may be positioned between second portion 110 and first area 128. Additionally, third area 132 may be positioned between second portion 110 and second area 130, and fourth area 134 may be positioned between second portion 110 and third area 132.

In the non-limiting example, each of the plurality of distinct areas 128, 130, 132, 134 of first portion 108 may include distinct doping concentrations (DC1a, DC2a, DC3a, DC4a) from one another. Additionally, the second doping concentration (DC2) of second portion 110 of P-well 106 may also be distinct from the doping concentrations (DC1a, DC2a, DC3a, DC4a) associated with each of the plurality of distinct areas 128, 130, 132, 134 of first portion 108. Specifically, the second doping concentration (DC2) of second portion 110 of P-well 106 may be greater than the doping concentrations (DC1a, DC2a, DC3a, DC4a) associated with each of the plurality of distinct areas 128, 130, 132, 134 of first portion 108. The second doping concentration (DC2) of second portion 110 may be between approximately $1.0\times10^{18}$ atoms per cubic cm (atoms/$cm^3$) and approximately $1.5\times10^{19}$ atoms/$cm^3$. Additionally in the non-limiting example, the doping concentrations (DC1a, DC2a, DC3a, DC4a) for each of the plurality of areas 128, 130, 132, 134 of first portion 108 of P-well 106 may be between approximately $1.0\times10^{17}$ atoms per cubic cm (atoms/$cm^3$) and approximately $9.0\times10^{17}$ atoms/$cm^3$. Additionally, the doping concentration (DC1a) of first area 128 is less than the doping concentration (DC2a) of second area 130, the doping concentration (DC2a) of second area 130 is less than the doping concentration (DC3a) of third area 132, and the doping concentration (DC3a) of third area 132 is less than the doping concentration (DC4a) of fourth area 134.

In the non-limiting example shown in FIG. 3, each of the plurality of areas 128, 130, 132, 134 of first portion 108 for P-well 106 may be formed to include substantially equal thicknesses. Alternatively, and as shown in the non-limiting example of FIG. 4, each of the plurality of areas 128, 130, 132, 134 of first portion 108 for P-well 106 may be formed to include distinct thicknesses, where the first area 128 includes the smallest thickness, and fourth area 134 includes the largest thickness. In another non-limiting example (not shown), each of the plurality of areas 128, 130, 132, 134 of first portion 108 for P-well 106 may be formed to include distinct thicknesses, where the first area 128 includes the largest thickness, and fourth area 134 includes the smallest thickness.

FIGS. 5-19 show various cross-sectional front views of MOSFET 100 undergoing a build process. More specifically, FIGS. 5-10 depict the building, formation, and/or manufacturing of MOSFET 100 shown in FIGS. 1 and 2, and FIGS. 11-19 depict the building, formation, and/or manufacturing of MOSFET 100 shown in FIG. 3. Each of the features, components, devices, portions, and/or layers of MOSFET 100 may be formed or manufactured therein using any suitable manufacturing methods, processes, or techniques. That is, features, components, devices, portions, and/or layers of MOSFET 100 may be formed using any suitable material deposition, material removal, and/or layer formation techniques or processes, as discussed herein. Some suitable processes or techniques may include, but are not limited to, material growing/growth, material deposition, chemical-mechanical polishing (CMP), doping/ion implantation, bonding, annealing, etching, masking, photolithography, metal organic chemical vapor deposition (MOCVD), electronbeam (E-beam) evaporation, and so on. Additionally, it is understood that similarly numbered and/or named components may function in a substantially similar fashion. Redundant explanation of these components has been omitted for clarity.

Figure 5:
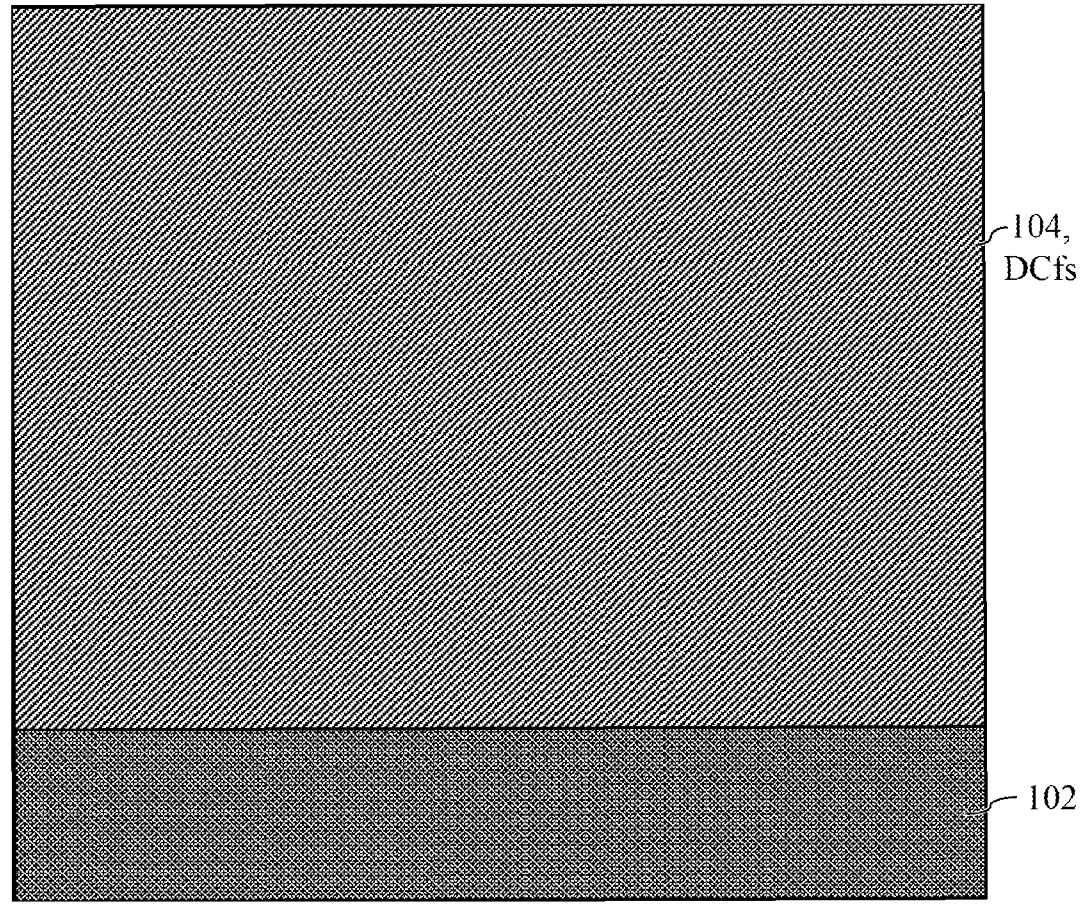
FIGS. 5-10 show cross-sectional views of the MOSFET of FIGS. 1 and 2 undergoing build processes, according to embodiments of the disclosure.

FIG. 5 shows the formation of drift layer 104 over substrate 102. Specifically, a material forming drift layer 104 may be epitaxially-grown over and may substantially cover substrate 102. Additionally, drift layer 104 formed (e.g., grown) over substrate 102 may include a doping concentration (DCfs) and/or may be grown to include the doping concentration (DCfs).

Figure 6:
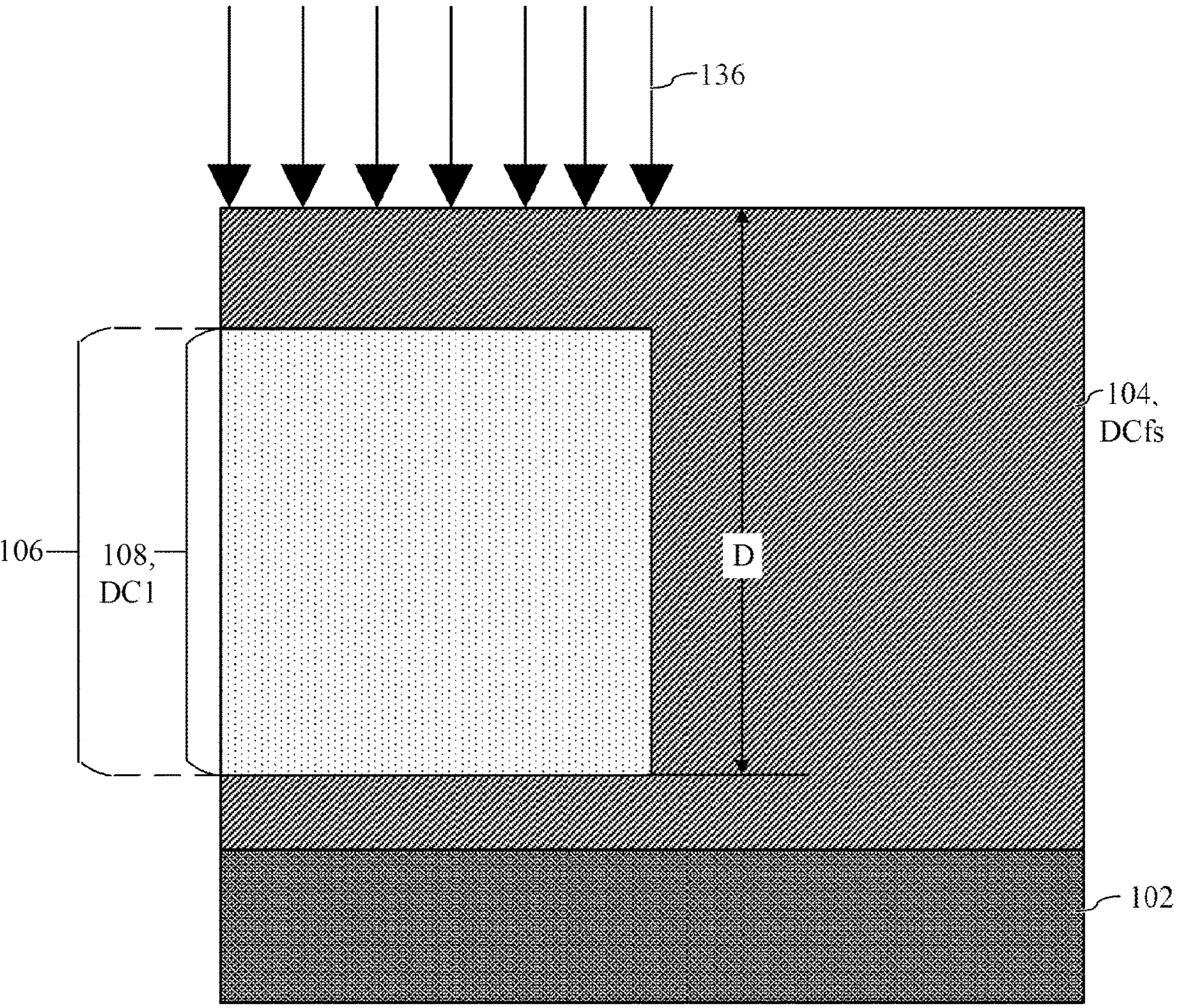

FIG. 6 depicts the formation of P-well 106. In the non-limiting example, a portion of drift layer 104 may be doped using deep or channeling implantation processes to form P-well 106. More specifically, drift layer 104 may be doped using channeling implantation (e.g., ion implantation at a calibrated or predetermined angle) to form first portion 108 of P-well 106. Doping the portion of drift layer 104 to form first portion 108 of P-well 106 may include penetrating drift layer 104 a predetermined distance (D) with first ion concentration 136 under first operational parameters to form first portion 108 approximately 1.0 micron (μm) to approximately 2.5 μm from oxide layer 118 (see, FIG. 11). Operational parameters for first ion concentration 136 while performing channeling implantation may include directing ions toward drift layer 104 at a predetermined angle and/or performing channeling implantation on drift layer 104 at a predetermined temperature. The predetermined angle may be relative to a predefined axis of the crystalline lattice for the material forming drift layer 104. In the non-limiting example shown in FIG. 6, first ion concentration 136 may be directed toward drift layer 104 at substantially a zero (0°) angle and/or relatively parallel to the axis of drift layer 104. Additionally in the non-limiting example, first ion concentration 136 may be directed toward drift layer 104 during the channeling implantation while drift layer 104 and/or the ambient temperature surrounding drift layer 104 is substantially equal to a room temperature (e.g., 20° C.). That is, drift layer 104 may not be substantially heated or cooled, prior to/while performing channeling implantation.

Figure 7:
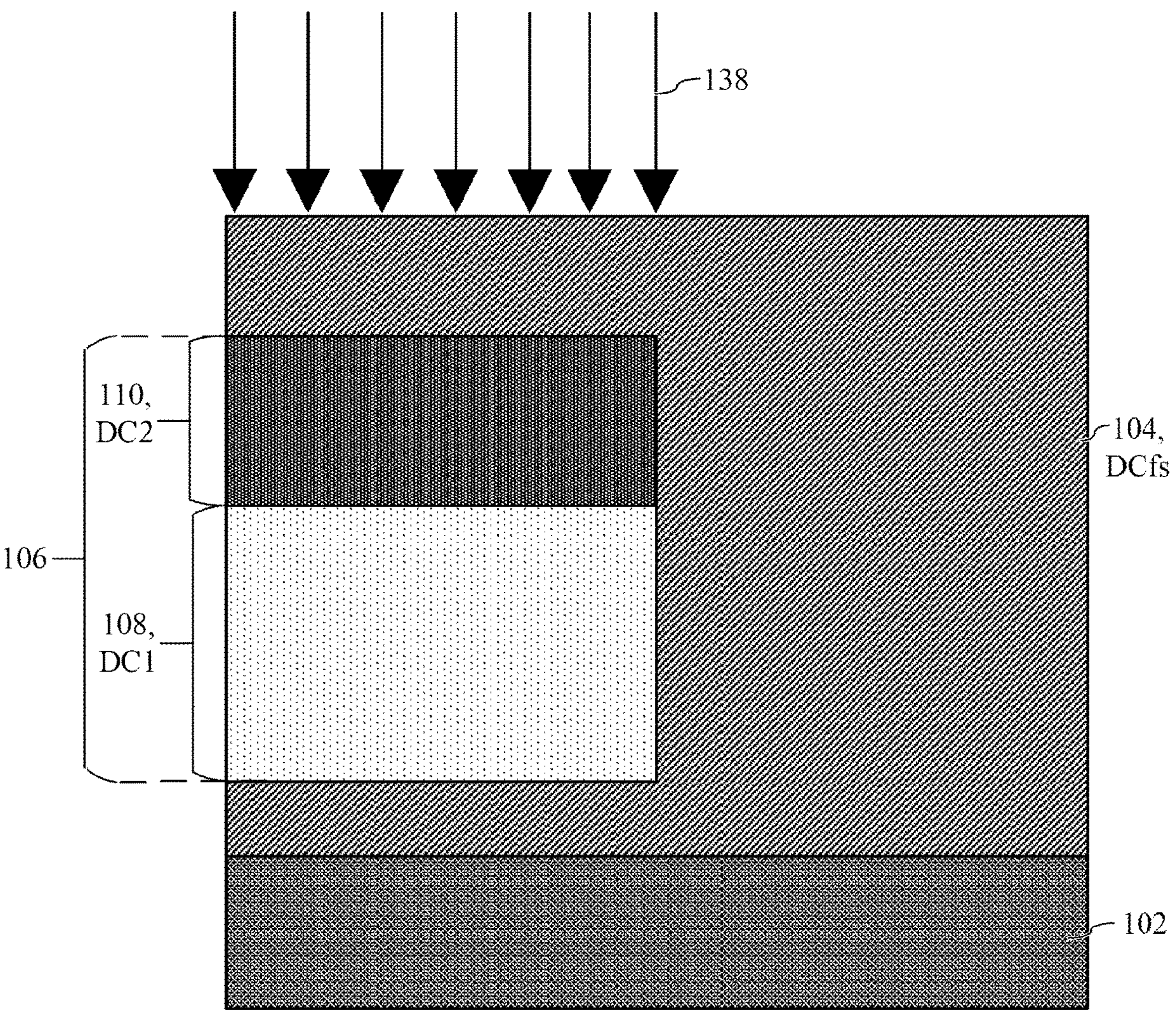

FIG. 7 also depicts the formation of P-well 106. In the non-limiting example, a portion of drift layer 104 may be doped via random ion implantation to form distinct portions of P-well 106. More specifically, a portion of first portion 108 of P-well 106 (previously drift layer 104) may be doped (again) to form second portion 110 of P-well 106. Doping the portion of drift layer 104/P-well 106 to form second portion 110 of P-well 106 may include penetrating P-well 106/drift layer 104 with second ion concentration 138 under second operational parameters to form second portion 110. The second ion concentration 138 and second operational parameters may be distinct from the first ion concentration and first operational parameters used to form first portion 108 of P-well 106. For example, second ion concentration 138 may be directed toward drift layer 104 during the random ion implantation while drift layer 104 and/or the ambient temperature surrounding drift layer 104 is greater than a room temperature (e.g., approximately 500° C.). That is, drift layer 104 may be substantially heated, prior to/while performing the random ion implantation process, as discussed herein.

Figure 8:
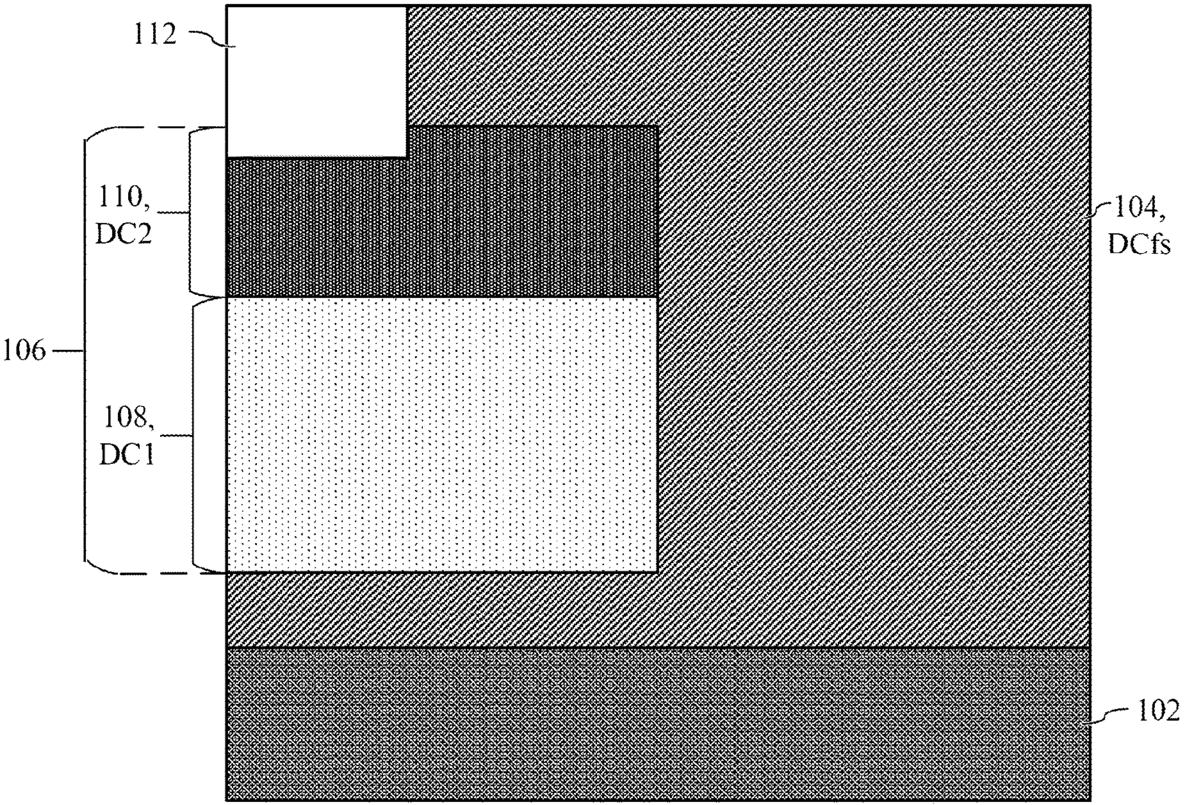

FIG. 8 depicts the formation of N-source 112 within MOSFET 100. More specifically, a portion of second portion 110 of P-well 106 may be doped to form N-source 112 within P-well 106.

Figure 9:
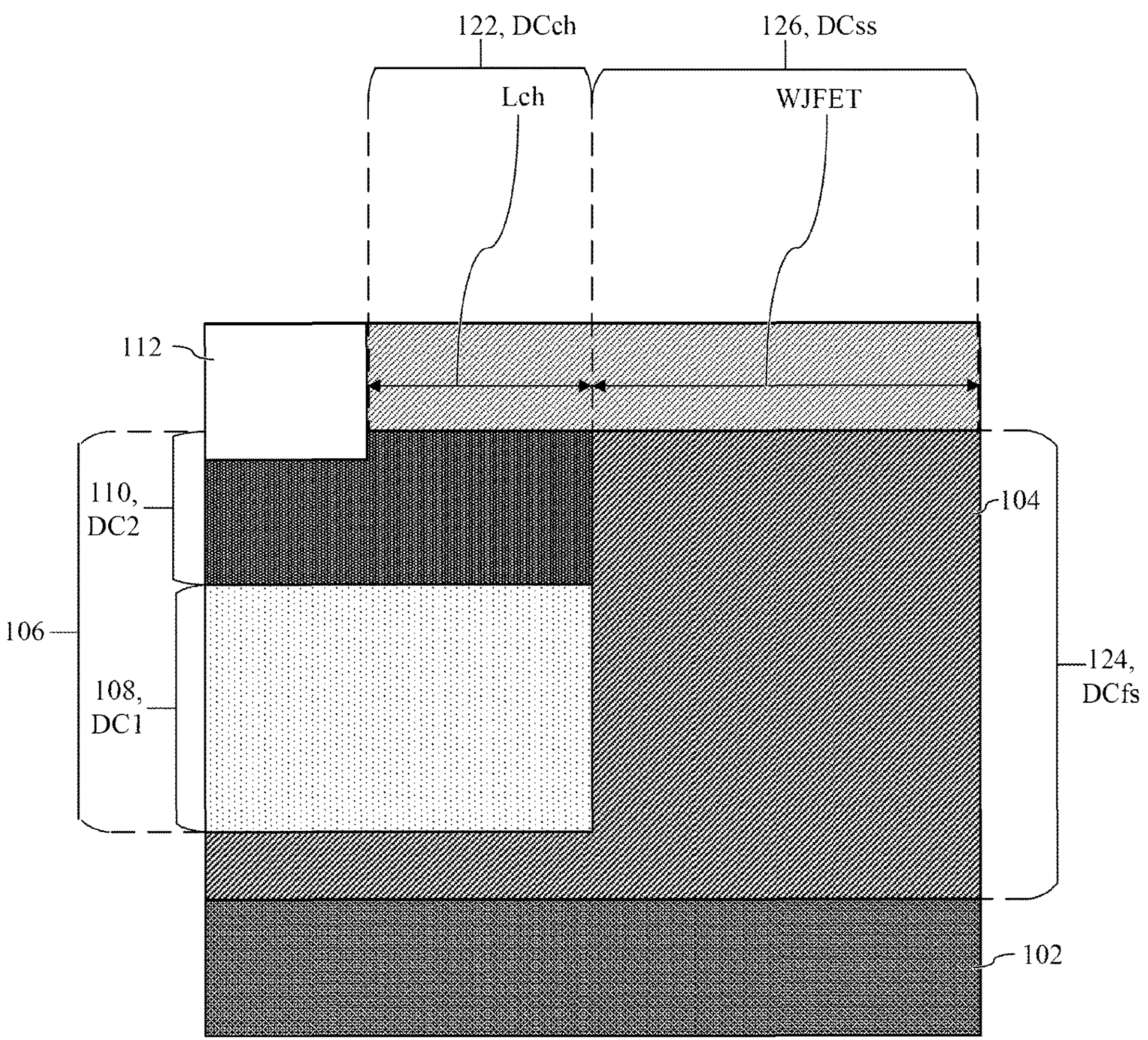

FIG. 9 shows the formation of channel region 122 and second section 126 of drift layer 104. More specifically, a portion of second portion 110 of P-well 106 positioned or formed adjacent N-source 112 may be doped via ion implantation to form channel region 122. Channel region 122 may be formed with a predetermined ion concentration and operational parameters to ensure channel region 122 includes a predetermined doping concentration. Additionally, a portion of drift layer 104 positioned or formed adjacent channel region 122 may be doped via ion implantation to form second section 126 of JFET region 105 for drift layer 104. Second section 126 of JFET region 105 may be formed with a predetermined ion concentration and operational parameters to ensure second section 126 includes a predetermined doping concentration that is distinct from the first section 124 of drift layer 104/JFET region 105.

Subsequent to the formation/doping of each, or alternatively all, of drift layer 104 (including channel region 122, first section 124, second section 126), first portion 108/second portion 110 of P-well 106, and N-source 112, each feature may be activated by performing an annealing process.

Figure 10:
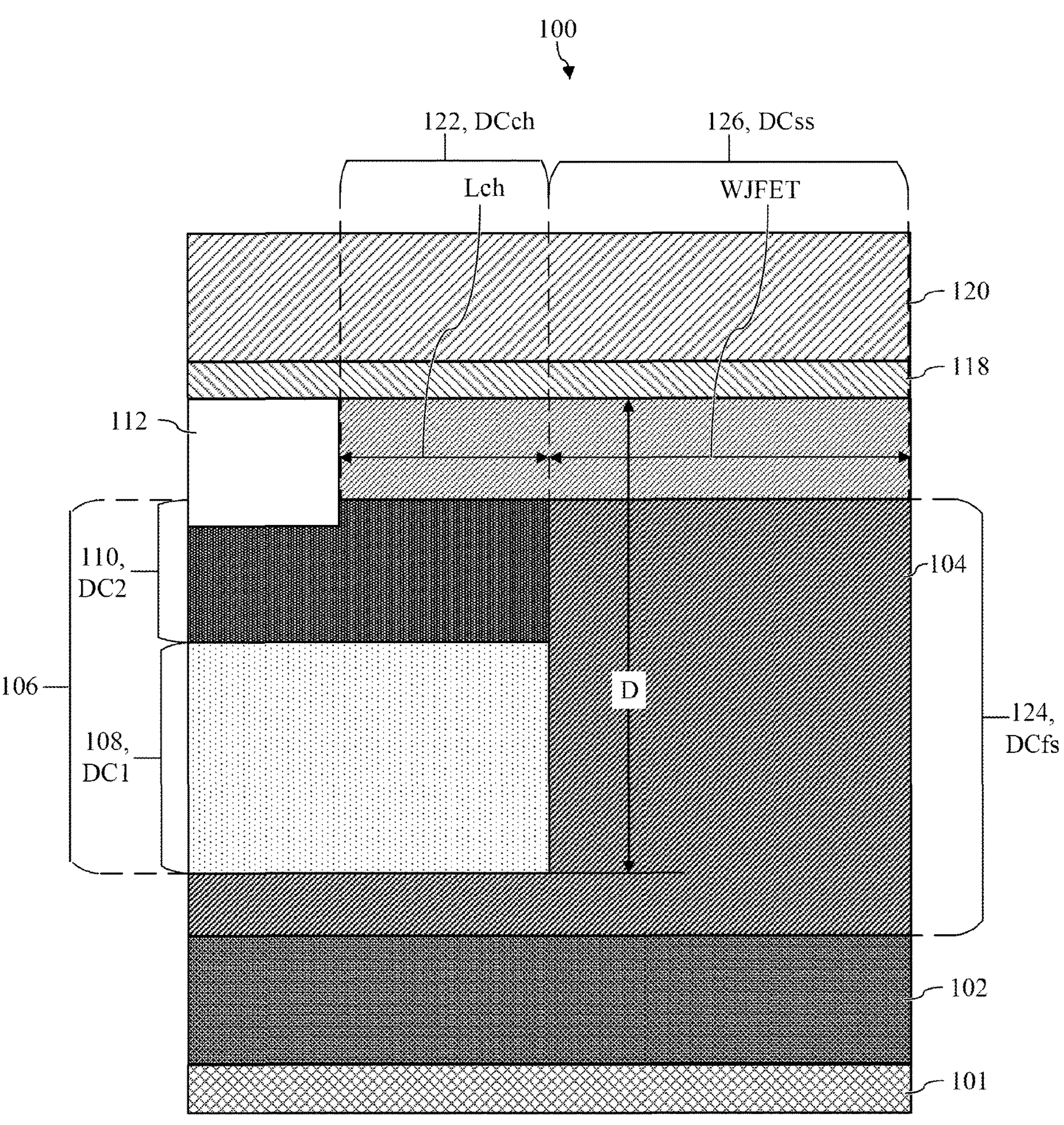

FIG. 10 shows the formation of oxide layer 118 and gate layer 120 in MOSFET 100. In a non-limiting example, oxide layer 118 may be deposited or thermally grown over exposed portions of N-source 112, channel region 122 and second section 126 (of drift layer 104), respectively. In FIG. 10, gate layer 120 may be deposited and/or disposed directly over oxide layer 118.

Figure 11:
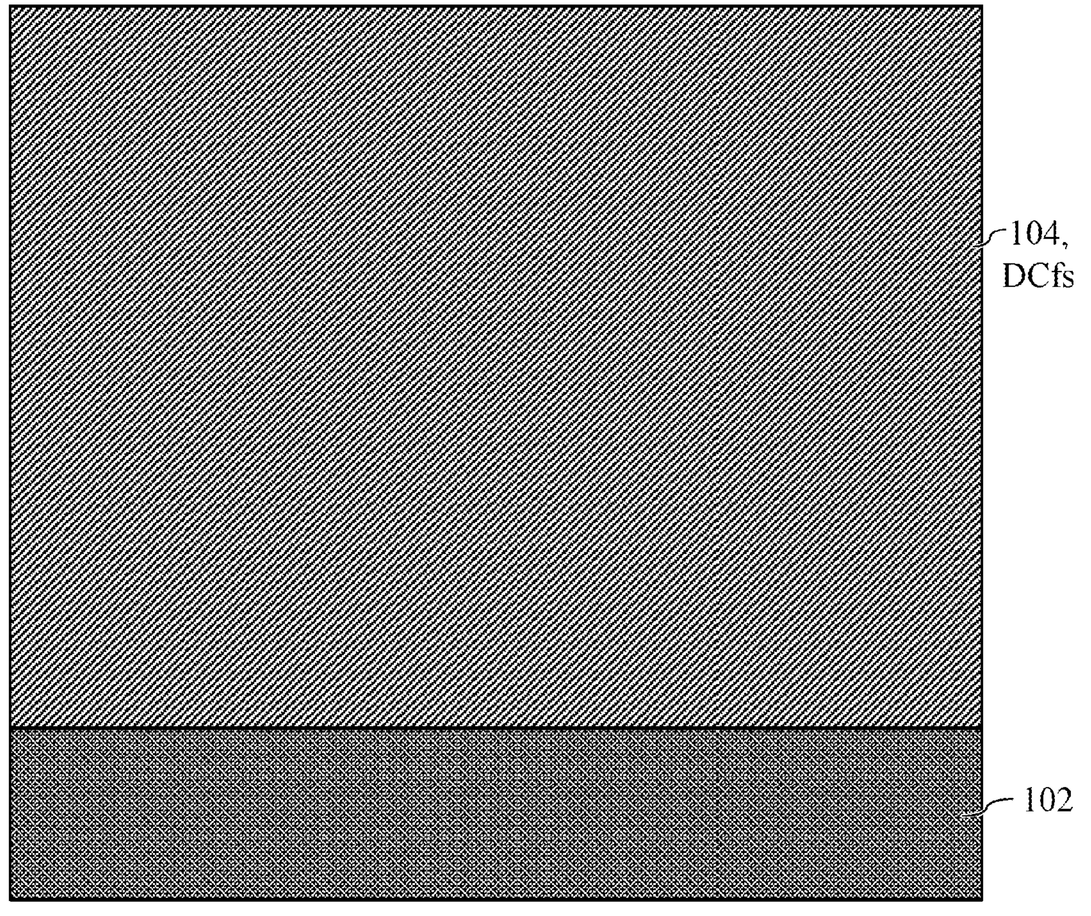
FIGS. 11-19 show cross-sectional views of the MOSFET of FIG. 3 undergoing build processes, according to embodiments of the disclosure.

As discussed herein, FIGS. 11-19 depict the building, formation, and/or manufacturing of MOSFET 100 shown in FIG. 3. FIG. 11 shows the formation of drift layer 104 over substrate 102. Specifically, a material forming drift layer 104 may be epitaxially-grown over and may substantially cover substrate 102. Additionally, drift layer 104 formed (e.g., grown) over substrate 102 may include a doping concentration (DCfs) and/or may be grown to include the doping concentration (DCfs).

Figure 12:
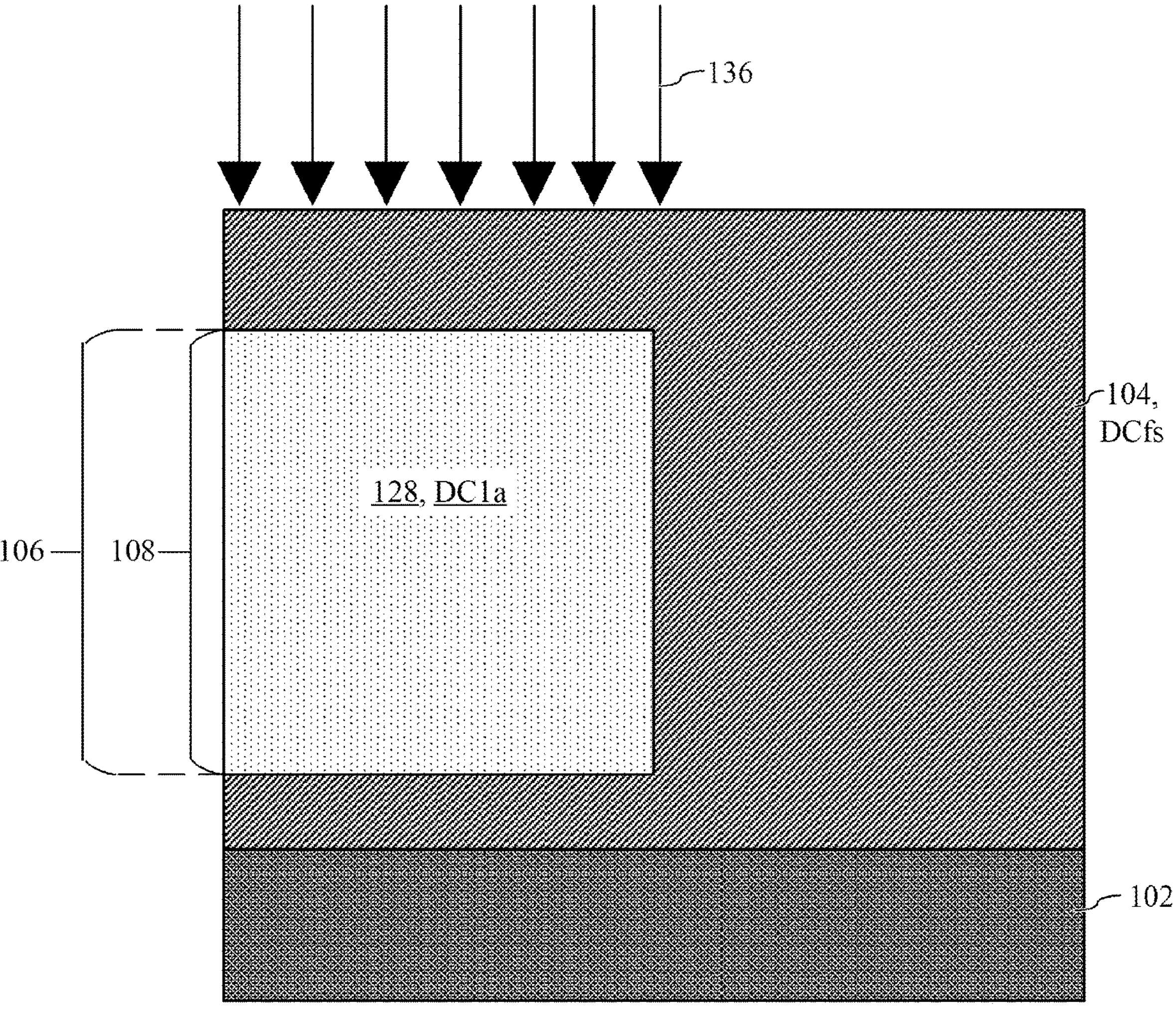

FIG. 12 depicts the formation of P-well 106. In the non-limiting example, a portion of drift layer 104 may be doped to form P-well 106. More specifically, drift layer 104 may be doped using deep or channeling implantation processes (e.g., ion implantation at a calibrated or predetermined angle) to form first portion 108 of P-well 106. In the non-limiting example, drift layer 104 may be doped to form first area 128 of first portion 108 of P-well 106. Doping the portion of drift layer 104 to form first area 128 of first portion 108 for P-well 106 may include penetrating drift layer 104 a predetermined distance (D) with first ion concentration 136 under first operational parameters to form first area 128 approximately 1.0 micron (μm) to approximately 2.5 μm from oxide layer 118 (see, FIG. 9). First area 128 may also include a predetermined doping concentration (DC1a). As similarly discussed herein with reference to FIG. 6, operational parameters for first ion concentration 136 while performing channeling implantation may include directing ions toward drift layer 104 at a predetermined angle and/or performing channeling implantation on drift layer 104 at a predetermined temperature, where the predetermined angle may be relative to a predefined axis of the crystalline lattice for the material forming drift layer 104.

Figure 13:
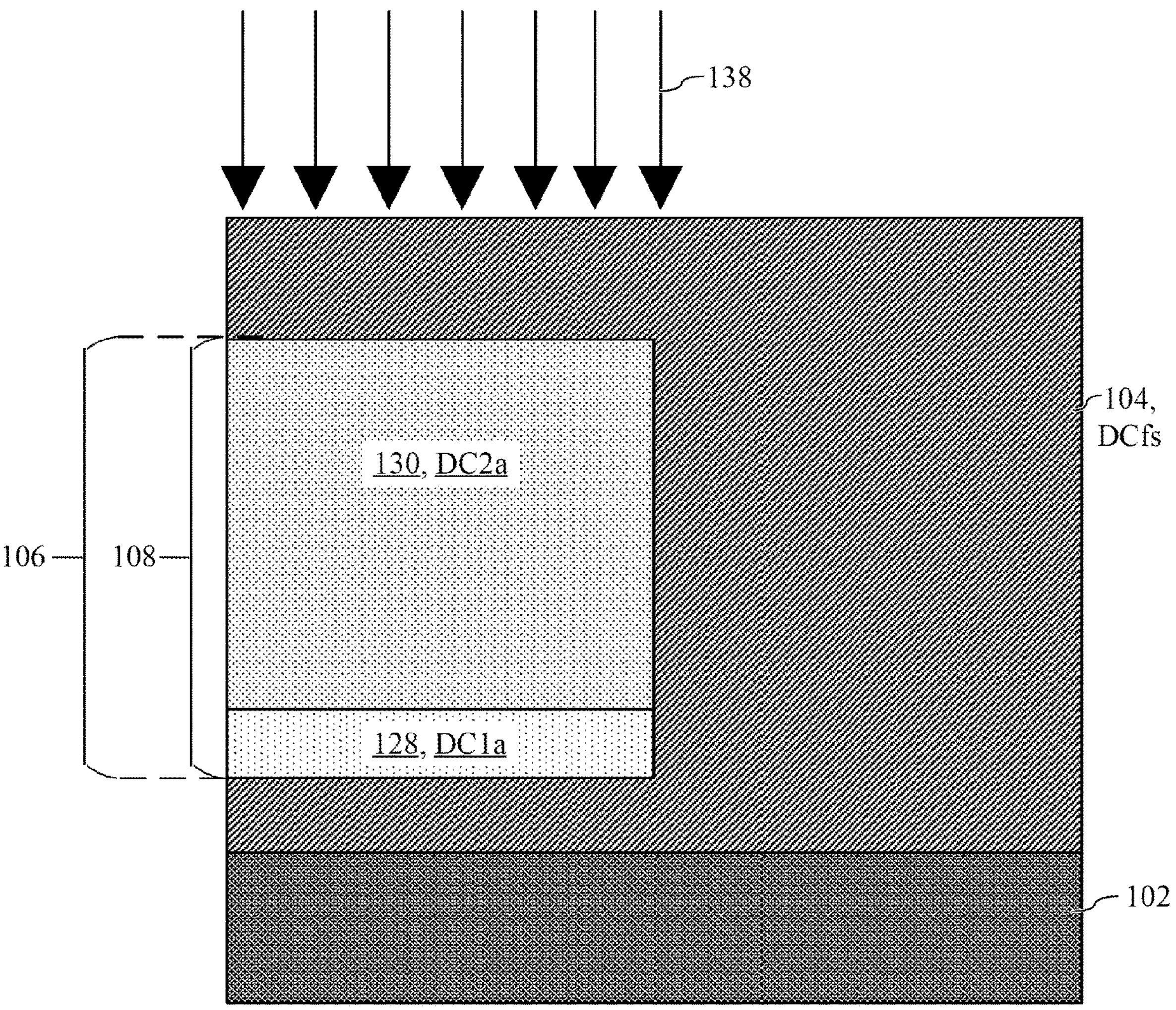

FIG. 13 also depicts the formation of P-well 106. In the non-limiting example, a portion of drift layer 104 may be doped via channeling implantation to form distinct areas of first portion 108 of P-well 106. More specifically, a portion of first area 128 of P-well 106 (previously drift layer 104) may be doped (again) using channeling implantation to form second area 130 of first portion 108 for P-well 106. Doping the portion of drift layer 104/first area 128 of P-well 106 to form second area 130 of P-well 106 may include penetrating P-well 106 with second ion concentration 138 under second operational parameters to form second area 130 in first portion 108. The second ion concentration 138 and second operational parameters may be distinct from the first ion concentration and first operational parameters used to form first area 128 of P-well 106. Additionally, second area 130 may also include a predetermined doping concentration (DC2a) that may be distinct from (e.g., greater) than the doping concentration (DC1a) of first area 128.

Figure 14:
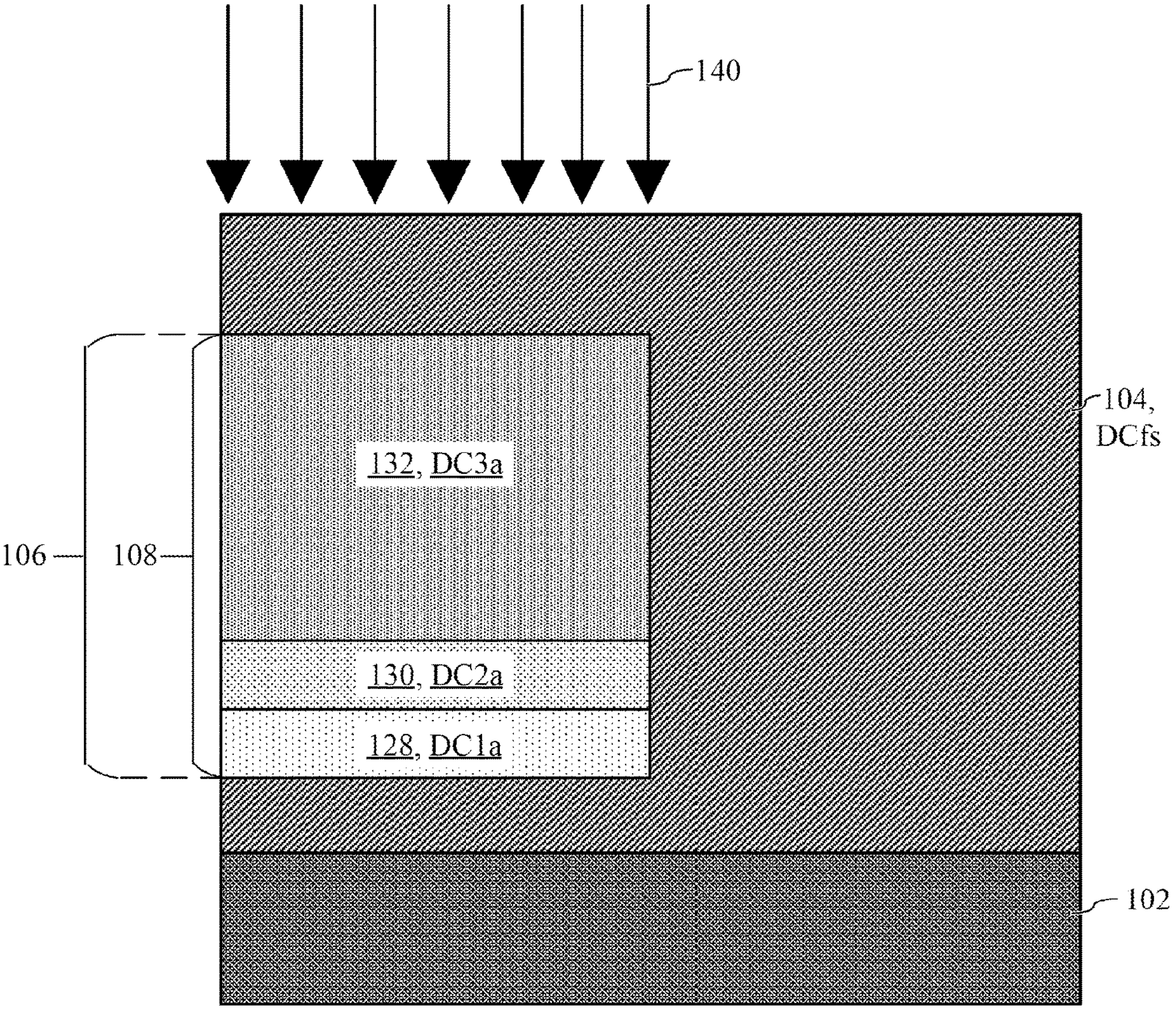

FIG. 14 depicts additional processes for forming first portion 108 of P-well 106. In the non-limiting example, a portion of second area 130 of P-well 106 (previously drift layer 104) may be doped (again) via channeling implantation to form third area 132 of first portion 108 for P-well 106. Doping the portion of drift layer 104/second area 130 of P-well 106 to form third area 132 of P-well 106 may include penetrating P-well 106 with a third ion concentration 140 under third operational parameters to form third area 132 in first portion 108. The third ion concentration 140 and third operational parameters may be distinct from the first/second ion concentration and first/second operational parameters used to form first area 128/second area 130 of P-well 106. Additionally, third area 132 may also include a predetermined doping concentration (DC3a) that may be distinct from (e.g., greater) than the doping concentration (DC2a) of second area 130.

Figure 15:
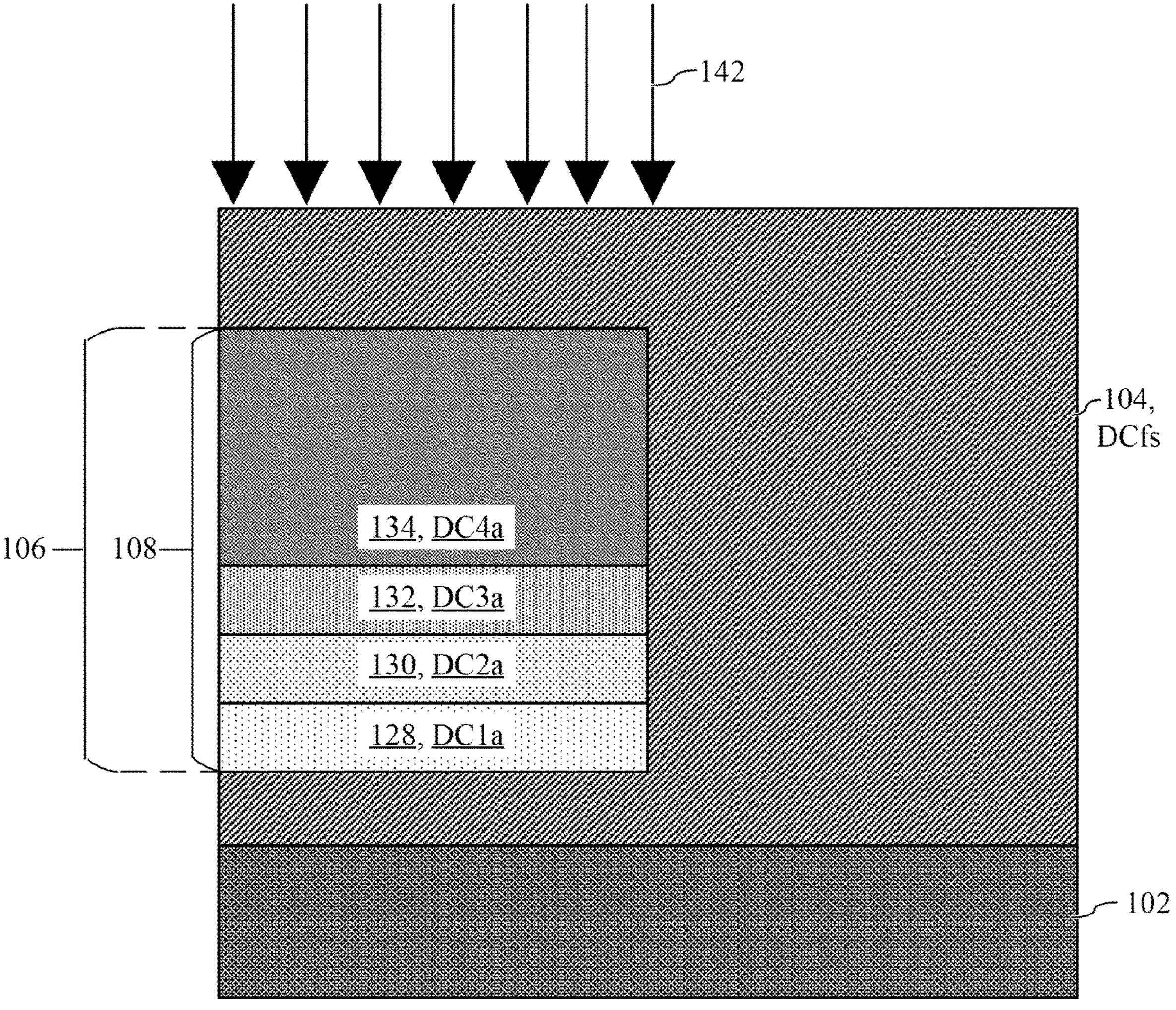

FIG. 15 depicts a further process for forming first portion 108 of P-well 106. In the non-limiting example, a portion of third area 132 of P-well 106 (previously drift layer 104) may be doped (again) using channeling implantation to form fourth area 134 of first portion 108 for P-well 106. Doping the portion of drift layer 104/third area 132 of P-well 106 to form fourth area 134 of P-well 106 may include penetrating P-well 106 with a fourth ion concentration 142 under fourth operational parameters to form fourth area 134 in first portion 108. The fourth ion concentration 142 and fourth operational parameters may be distinct from the first/second/third ion concentration and first/second/third operational parameters used to form first area 128/second area 130/third area 132 of P-well 106. Additionally, fourth area 134 may also include a predetermined doping concentration (DC4a) that may be distinct from (e.g., greater) the other doping concentrations (DC3a, DC2a, DC1a) of distinct areas 128, 130, 132 of first portion 108. Further embodiments may include a first portion 108, having five or more distinct areas, even upwards of tens and hundreds of distinct areas, with the last distinct area formed prior to second portion 110 comprising a terminal distinct area. The Nth distinct area of some number (N) of distinct areas, may be formed with an (N+1) ion concentration under (N+1) operational parameters. In such cases, the second portion may be formed using an (N+2) ion concentration under (N+2) operational parameters.

Figure 16:
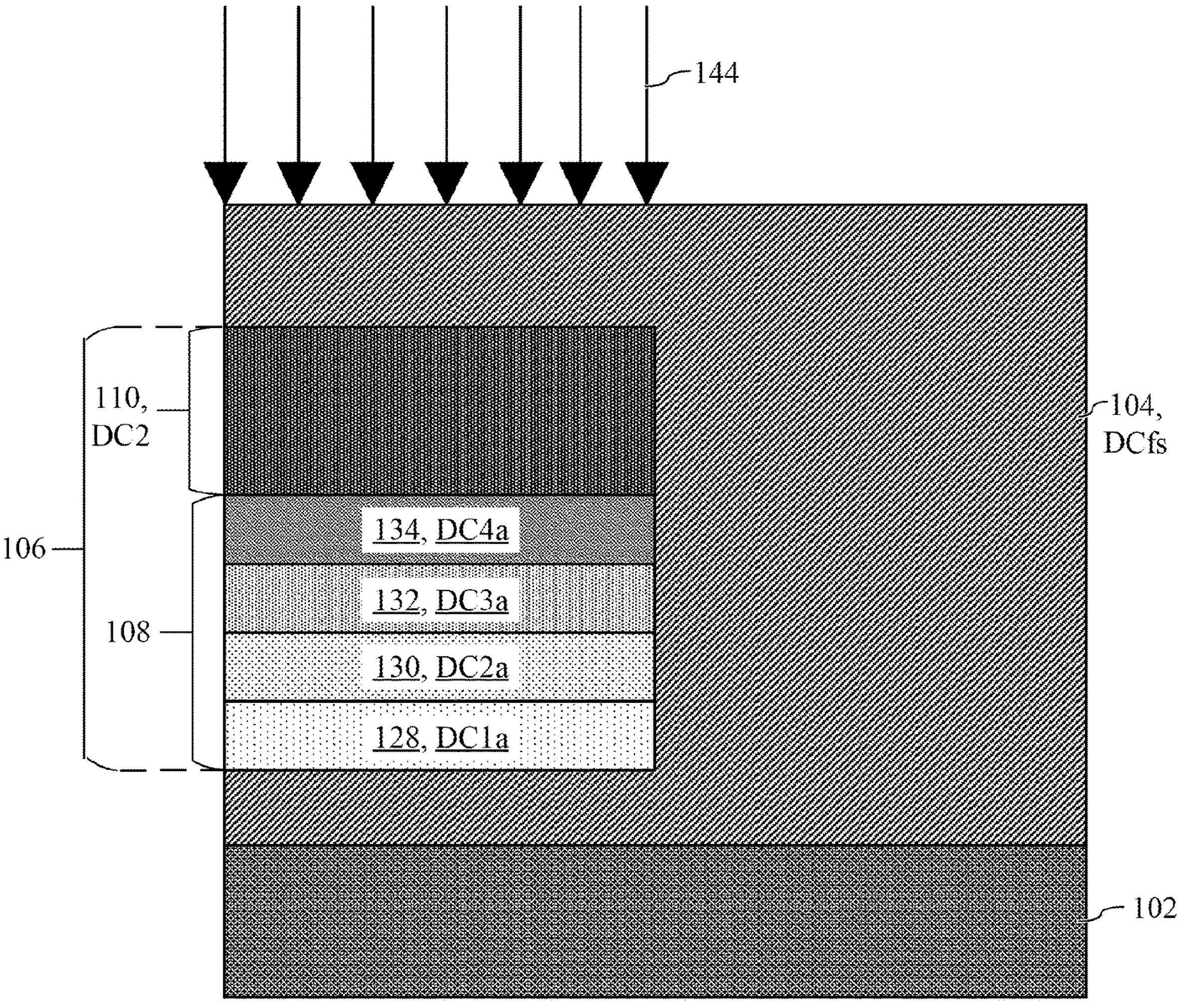

FIG. 16 also depicts the formation of P-well 106. In the non-limiting example, a portion of first portion 108 (e.g., fourth area 134) of P-well 106 (previously drift layer 104) may be doped (again) via random ion implantation to form second portion 110 of P-well 106. Doping the portion of drift layer 104/P-well 106 to form second portion 110 of P-well 106 may include penetrating P-well 106/drift layer 104 with a final ion concentration 144 under final operational parameters to form second portion 110. The final ion concentration 144 and final operational parameters used to form second portion 110 may be distinct from the ion concentrations and operational parameters used to form first portion 108 (e.g., areas 128, 130, 132, 134) of P-well 106.

Figure 17:
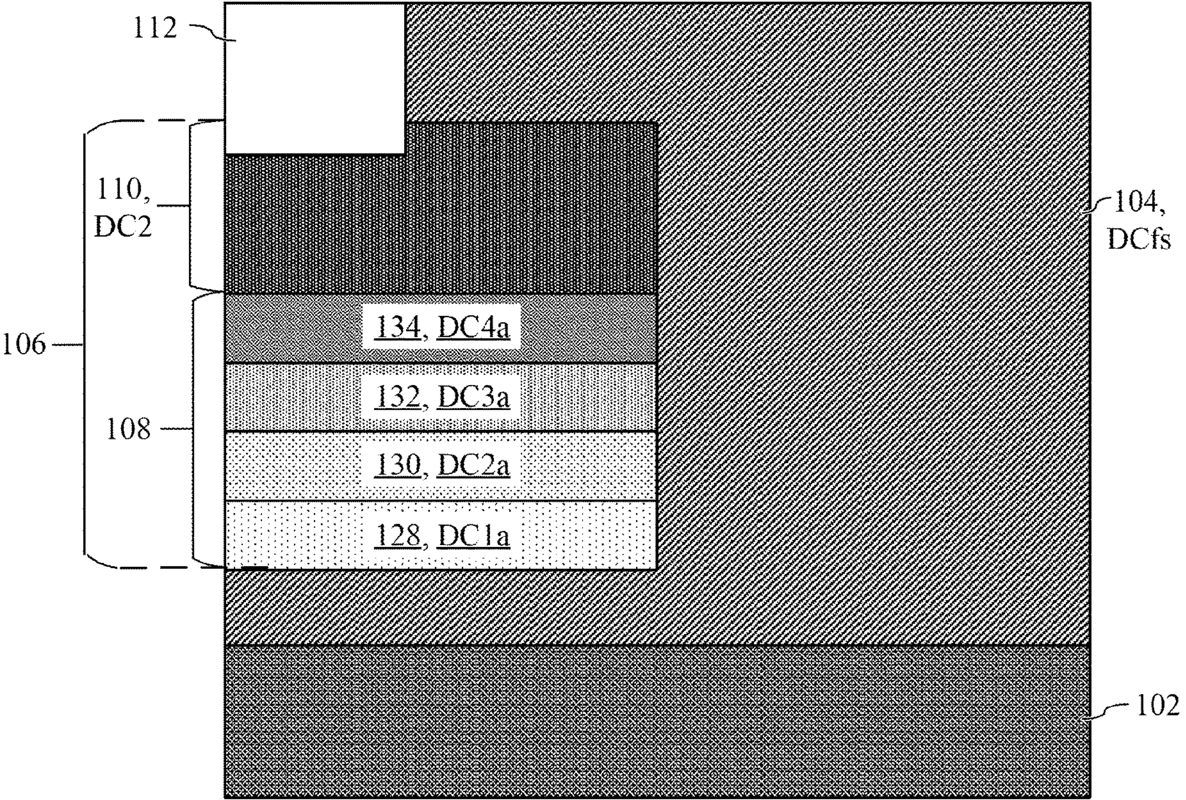

FIG. 17 depicts the formation of N-source 112 within MOSFET 100. More specifically, a portion of second portion 110 of P-well 106 may be doped to form N-source 112 within P-well 106.

Figure 18:
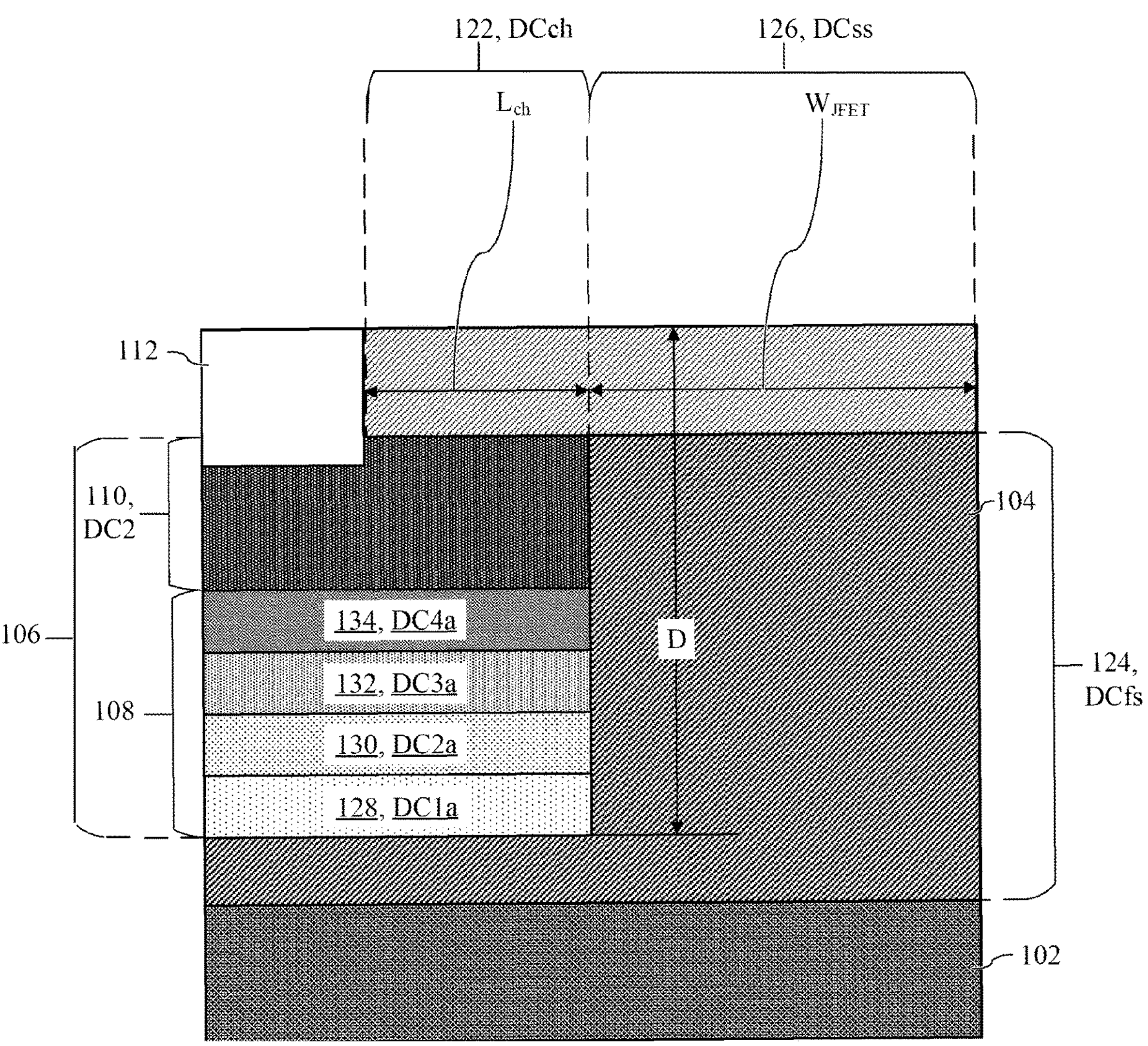

FIG. 18 shows the formation of channel region 122 and second section 126 of drift layer 104. More specifically, a portion of second portion 110 of P-well 106 positioned or formed adjacent N-source 112 may be doped via ion implantation to form channel region 122. Channel region 122 may be formed with a predetermined ion concentration and operational parameters to ensure channel region 122 includes a predetermined doping concentration. Additionally, a portion of drift layer 104 positioned or formed adjacent channel region 122 may be doped via ion implantation to form second section 126 of JFET region 105 for drift layer 104. Second section 126 of JFET region 105 may be formed with a predetermined ion concentration and operational parameters to ensure second section 126 includes a predetermined doping concentration that is distinct from the first section 124 of drift layer 104/JFET region 105.

Subsequent to the formation/doping of each, or alternatively all, of drift layer 104 (including channel region 122, first section 124, second section 126), first portion 108 and/or second portion 110 of P-well 106, and N-source 112, each feature may be activated by performing an annealing process.

Figure 19:
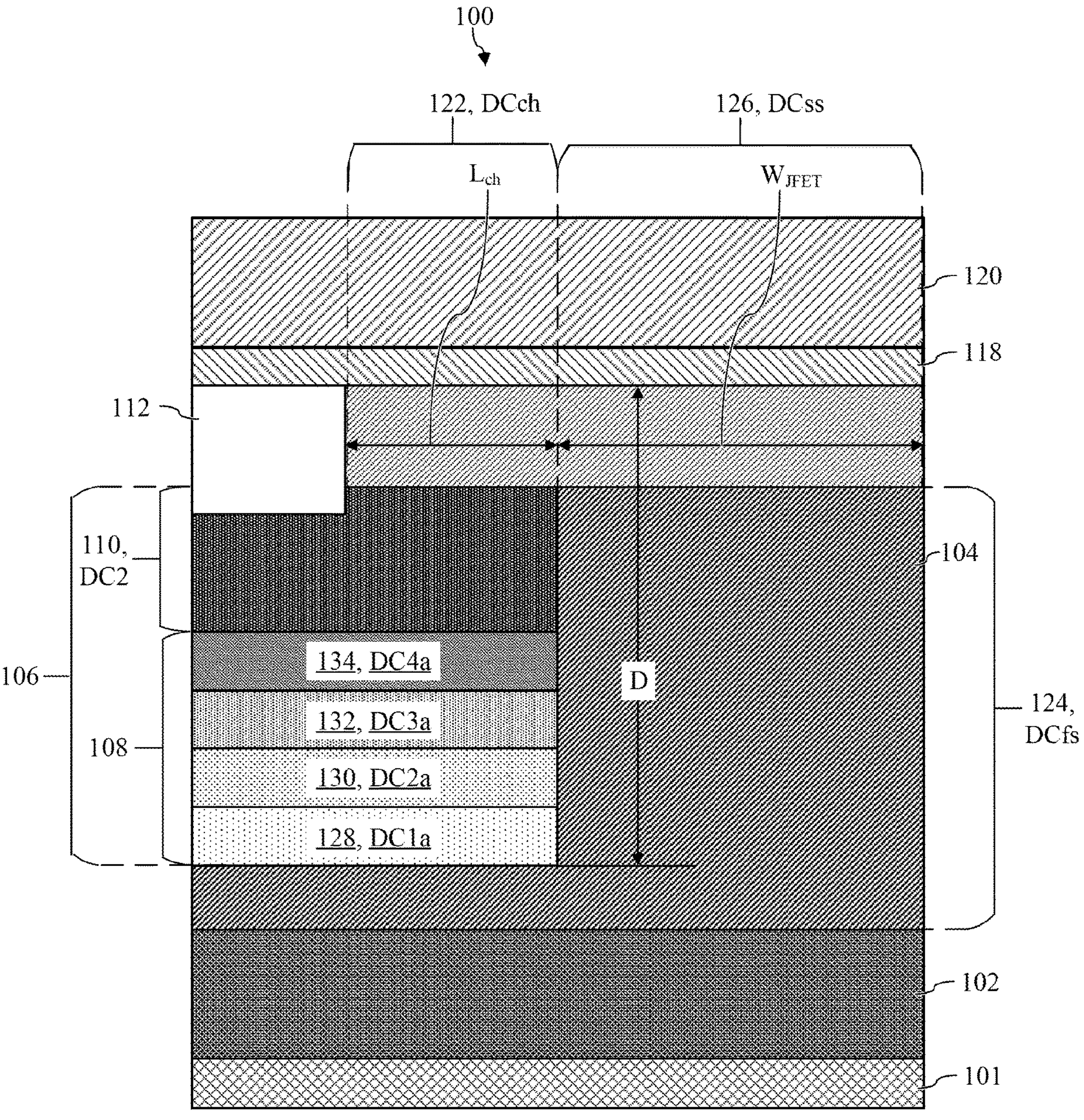

FIG. 19 shows the formation of oxide layer 118 and gate layer 120 in MOSFET 100. In a non-limiting example, oxide layer 118 may be deposited or thermally grown over exposed portions of N-source 112, channel region 122 and second section 126 (of drift layer 104), respectively. In FIG. 19, gate layer 120 may be deposited and/or disposed directly over oxide layer 118.

Figure 20:
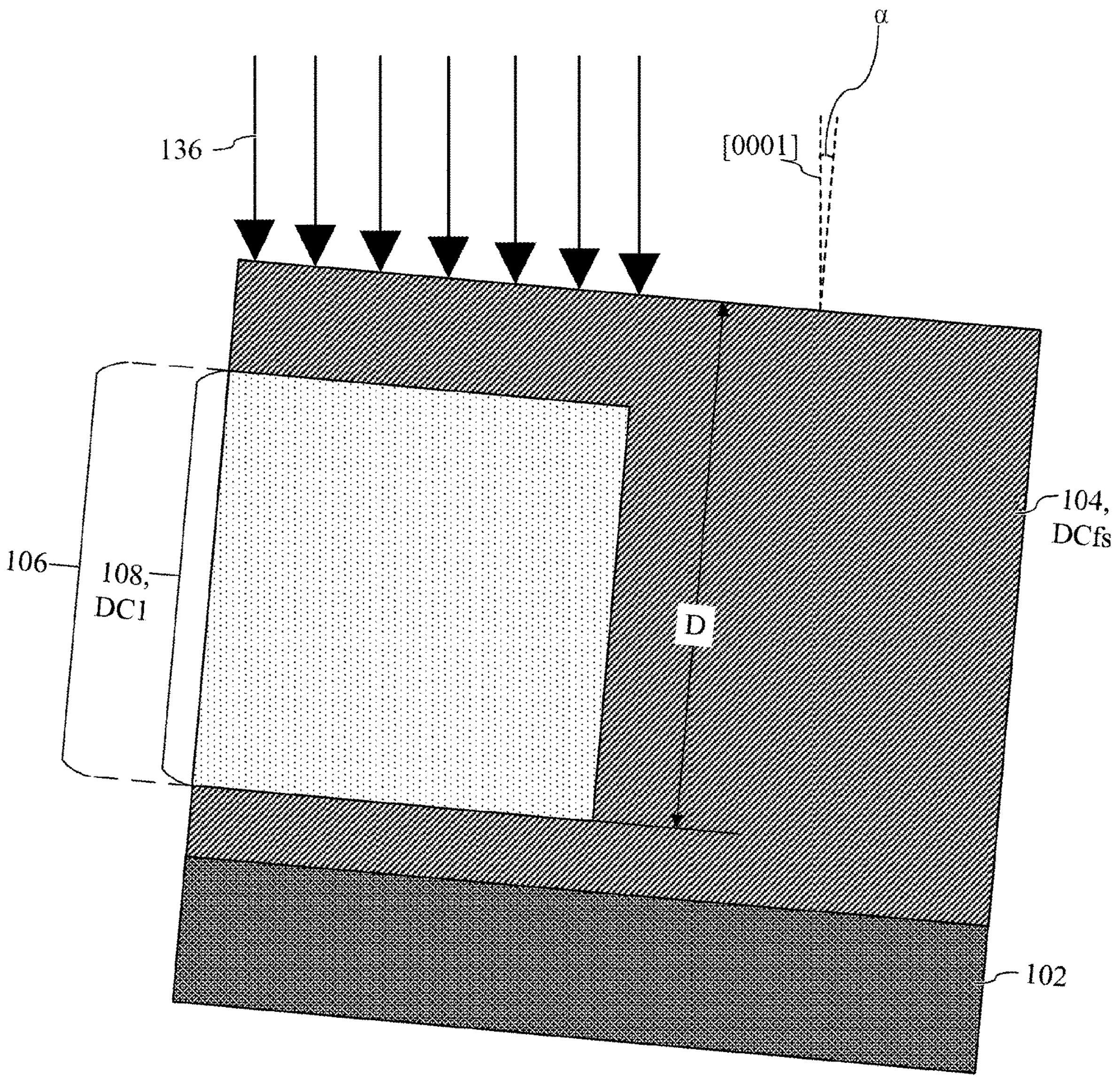
FIGS. 20 and 21 show cross-sectional view of the MOSFET of FIGS. 1 and 2 undergoing build processes, according to additional embodiments of the disclosure.
Figure 21:
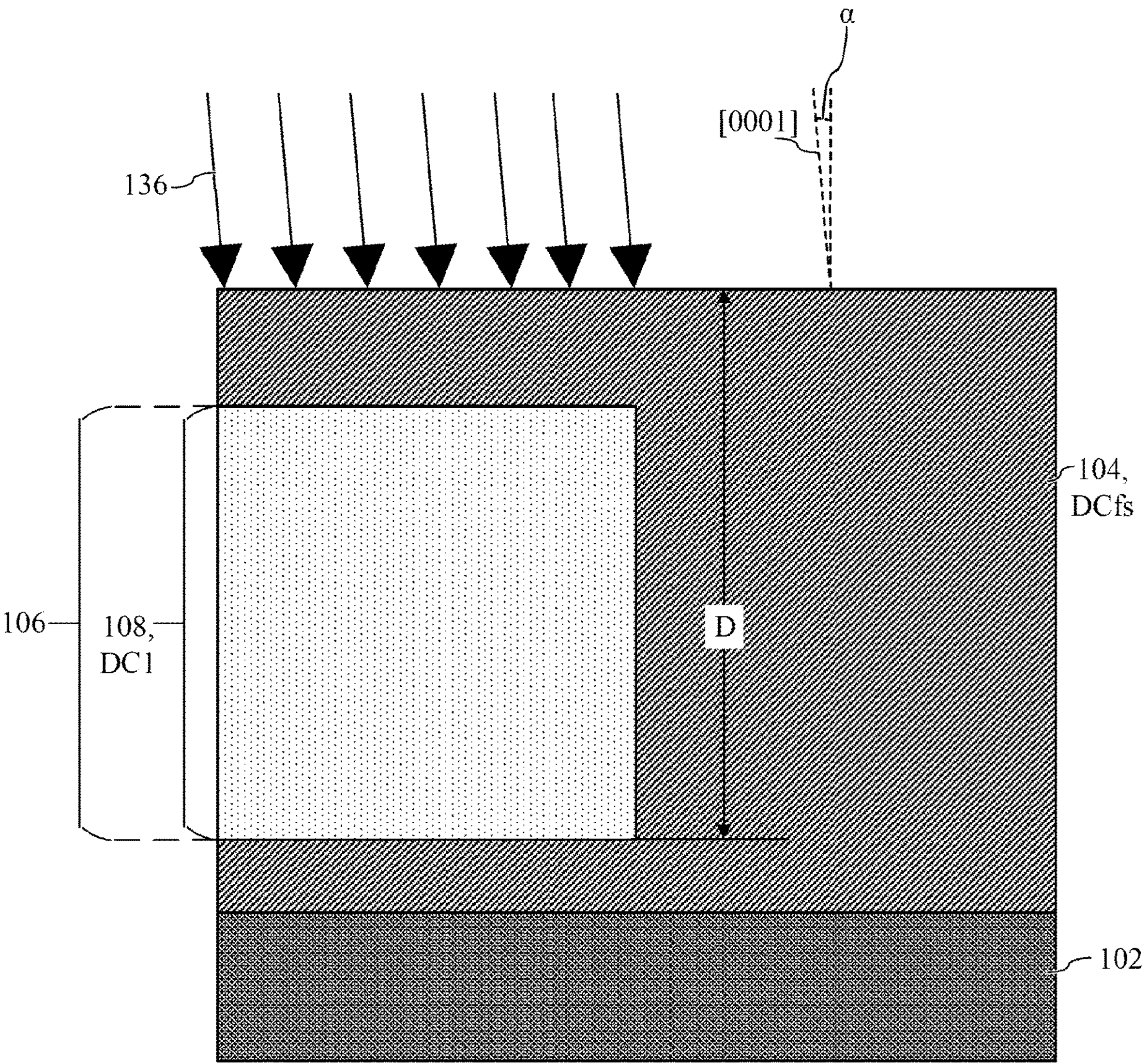

As discussed herein, ion concentrations (e.g., first ion concentration 136, second ion concentration 138, etc.) may be used to form different portions of P-well 106 within drift layer 104. Ion concentrations may penetrate drift layer 104 a predetermined distance (D) under predetermined operational parameters. Additionally as discussed herein with respect to channeling implantation (see e.g., FIG. 6), the operational parameters may include directing ions toward drift layer 104 at a predetermined angle and/or performing channeling implantation on drift layer 104 at a predetermined temperature. The predetermined angle may be relative to a predefined axis of the crystalline lattice for the material forming drift layer 104. FIGS. 20 and 21 show additional non-limiting examples of performing the channeling implantation process on drift layer 104 to form a portion of P-well 106, as similarly discussed herein with reference to FIGS. 6 and/or 12.

Turning to FIGS. 20 and 21, non-limiting examples of performing the channeling implantation process on drift layer 104 are shown. More specifically, FIGS. 20 and 21 depict the formation of P-well 106 using a channeling implantation process. As shown, doping the portion of drift layer 104 to form first portion 108 of P-well 106 may include penetrating drift layer 104 a predetermined distance (D) with first ion concentration 136 under first operational parameters to form first portion 108. In the non-limiting example shown in FIGS. 20 and 21, first ion concentration 136 may be directed toward drift layer 104 at a predetermined angle (α) relative to the axis of drift layer 104. Predetermined angle (α) in which first ion concentration 136 may be implanted into drift layer 104 may be between approximately one degree (1°) and five degrees (5°).

In the non-limiting example shown in FIG. 20, drift layer 104 and substrate 102 may be angled at the predetermined angle (α) relative to the axis of drift layer 104. That is, substrate 102 may be formed, built, and/or may have material removed such that subsequent layers (e.g., drift layer 104) formed thereon may also include or be oriented at angle (α). During operation, and because of the angle (α) of drift layer 104, ion implantations at a predetermined angle (α) (i.e. first ion concentration 136, second ion concentration 138, etc.) may be accelerated toward drift layer 104 also at angle (α) relative to the axis of drift layer 104.

In the non-limiting example shown in FIG. 21, first ion concentration 136 may be accelerated and/or implanted within drift layer 104 at the predetermined angle (α). That is, and distinct from the non-limiting example shown in FIG. 20, substrate 102 and drift layer 104 may not be formed, built, and/or oriented at an angle (α) relative to the axis of drift layer 104. Rather, first ion concentration 136 may be accelerated toward and/or implanted within drift layer 104 at the predetermined angle (α) relative to the axis of drift layer 104. In the non-limiting example shown in FIG. 21, the device (e.g., particle gun)(not shown) used to form and/or accelerate first ion concentration 136 may be angled relative to drift layer 104 in order for first ion concentration 136 to be implanted at the predetermined angle (α).

Figure 22:
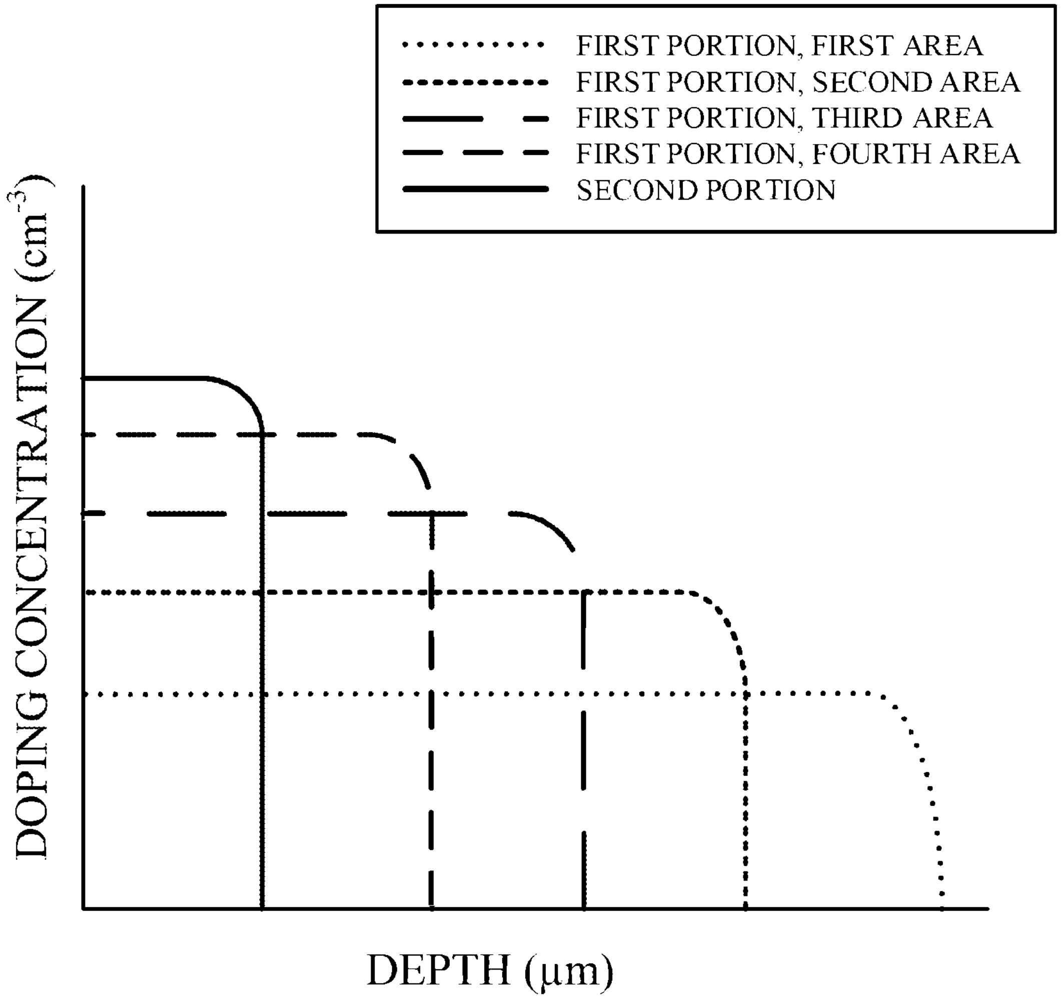
FIG. 22 shows a graphical illustration of a doping concentration for the MOSFET of FIG. 3, according to embodiments of the disclosure.

FIG. 22 shows a graphical illustration of the doping concentrations ($cm^{-3}$) for MOSFET 100 shown and discussed herein with respect to FIG. 3 or 4. Specifically, FIG. 20 shows plot points relating to the doping concentration for the first portion 108 having the plurality of distinct areas 128, 130, 132, 134, and second portion 110 (see, FIGS. 3 and 4) for P-well 106, based on depth (μm). As shown in the non-limiting example, forming P-well 106 to include first portion 108 having the plurality of distinct areas 128, 130, 132, 134, and second portion 110 (see, FIGS. 3 and 4), all having distinct and varied doping concentrations, may improve and/or increase the breakdown voltage within P-well 106 of MOSFET 100. The formation of P-well 106 as shown may improve and/or increase breakdown voltage as a result of preventing/reducing high electric field at gate layer 120, and/or increasing channel potential. Additionally, or alternatively, the breakdown voltage may be improved/increased in P-well 106 because of the lower/varied doping concentration in first portion 108 of P-well 106. That is, as a result of the doping concentration variation within first portion 108 of P-well 106 (e.g., doping concentration decreases from fourth area 134 to first area 128), the breakdown voltage of P-well 106 may be improved/increased.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately" and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

In embodiments, the field effect transistor, includes: a substrate; a drift layer disposed over the substrate; a P-well disposed within the drift layer, the P-well including: a first portion disposed directly over the drift layer, the first portion having at least one distinct area, each of the at least one distinct areas further comprising a respective doping concentration, and a second portion separated from the drift layer by the first portion, the second portion including a second doping concentration distinct from the first doping concentration of the first portion; an N-source disposed at least partially over the second portion of the P-well; an oxide layer disposed over the N-source and the drift layer; and a gate layer disposed over the oxide layer. In embodiments, the field effect transistor includes the second doping concentration of the second portion is greater than the respective doping concentration of the at least one distinct areas. In embodiments, the at least one distinct area of the first portion of the P-well include: a first distinct area positioned between the second portion and the drift layer, a second distinct area positioned between the second portion and the first distinct area, a third distinct area positioned between the second portion and the second distinct area, and a fourth distinct area positioned between the second portion and the third distinct area. In embodiments, the doping concentration of a terminal distinct area immediately adjacent to the second portion is less than the second doping concentration of the second portion of the P-well, and wherein a doping concentration for each consecutive intervening distinct area of one or more intervening distinct areas, formed between the terminal distinct area and the first distinct area, is decreased with respect to an immediately preceding distinct area with the first distinct area having the lowest doping concentration, for example wherein a fourth distinct area comprises a terminal distinct area, the doping concentration of the fourth distinct area is less than the second doping concentration of the second portion of the P-well with third, second, and first distinct areas each have a doping concentration lower than the immediately preceding distinct area. In embodiments, the second doping concentration of the second portion is between approximately $1.0\times10^{18}$ atoms per cubic cm (atoms/$cm^3$) and approximately $1.5\times10^{19}$ atoms/$cm^3$. In embodiments, the doping concentration for each of the at least one distinct areas of the first portion of the P-well is between approximately $1.0\times10^{17}$ atoms per cubic cm (atoms/$cm^3$) and approximately $9.0\times10^{17}$ atoms/$cm^3$. In embodiments, optionally similar to the embodiments above, the first portion of the P-well extends into the drift layer a predetermined depth (D) from the oxide layer. In embodiments, the predetermined depth (D) is between approximately 1.0 microns (μm) and approximately 2.5 μm. In embodiments, the drift layer includes: a channel region formed between the second portion of the P-well and the oxide layer, adjacent the N-source; and a junction gate field effect transistor (JFET) region positioned adjacent the P-well, the JFET region including: a first section formed directly adjacent the P-well, and a second section formed directly adjacent the channel region, the second section positioned between the oxide layer and the first section of the JFET region. In embodiments, the channel region includes a predetermined length between approximately 0.2 microns (μm) and approximately 2.0 μm. In embodiments, the second section defines a width of the JFET region, wherein that width is between approximately 0.2 microns (μm) and approximately 5.0 μm. In embodiments, the channel region includes a predetermined doping concentration between approximately $1.0\ 10^{16}$ atoms/$cm^3$ and approximately $9.0\times10^{16}$ atoms/$cm^3$, wherein the first section of the JFET region includes a first doping concentration between approximately $1.0\ 10^{16}$ atoms/$cm^3$ and approximately $9.0\times10^{16}$ atoms/$cm^3$, wherein the second section of the JFET region includes a second doping concentration between approximately $1.0\ 10^{16}$ atoms/$cm^3$ and approximately $9.0\times10^{16}$ atoms/$cm^3$, the second doping concentration of the second section distinct from the first doping concentration of the first section.

In embodiments, the method of forming the field effect transistor, includes: disposing a drift layer over a substrate; doping a portion of the drift layer to form a p-well within drift layer, the P-well including: a first portion disposed directly over the drift layer, the first portion having at least one distinct area, each of the at least one distinct areas having distinct doping concentrations, and a second portion separated from the drift layer by the first portion, the second portion including a second doping concentration distinct from the doping concentrations for each of the distinct areas of the first portion; doping a portion of the second portion of the P-well to form an N-source; disposing oxide an oxide layer over the N-source and the drift layer; and disposing a gate layer over the oxide layer. In embodiments, doping a portion of the drift layer further includes: performing channeling implantation at a first ion concentration under a first operational parameter to form the first portion of the P-well; performing channeling implantation at a second ion concentration under a second operational parameter to form the second portion of the P-well. In embodiments, doping a portion of the drift layer further includes: performing channeling implantation at a first ion concentration under a first operational parameter to form a first distinct area of the first portion of the P-well; performing channeling implantation at a second ion concentration under a second operational parameter to form the second distinct area of the first portion of the P-well; performing channeling implantation at intermediate ion concentrations between the first ion concentration and a final ion concentration under intermediate operational parameters to form any intervening distinct areas between the second distinct area, of the first portion of the P-well, and the second portion of the P-well.

In embodiments, the field effect transistor, includes: a substrate; a drift layer disposed over the substrate; a P-well disposed within the drift layer, the P-well including: a first portion disposed directly over the drift layer, the first portion including a first doping concentration, and a second portion separated from the drift layer by the first portion, the second portion including a second doping concentration distinct from the first doping concentration of the first portion; an N-source disposed at least partially over the second portion of the P-well; an oxide layer disposed over the N-source and the drift layer; and a gate layer disposed over the oxide layer. In embodiments, the first doping concentration of the first portion is less than the second doping concentration of the second portion.

In another embodiment, similar to that of the third embodiment, the second doping concentration of the second portion is between approximately $1.0\times10^{18}$ atoms per cubic cm (atoms/$cm^3$) and approximately $1.5\times10^{19}$ atoms/$cm^3$. In embodiments, similar to that of the third embodiment, the first doping concentration of the first portion is between approximately $1.0\times10^{17}$ atoms per cubic cm (atoms/$cm^3$) and approximately $4.0\times10^{17}$ atoms/$cm^3$. In embodiments, the first portion of the P-well extends into the drift layer a predetermined depth (D) from the oxide layer.

In another embodiment, similar to that of the above embodiment, the predetermined depth (D) is between approximately 1.0 microns (μm) and approximately 2.5 μm. In embodiments, the drift layer includes: a channel region formed between the second portion of the P-well and the oxide layer, adjacent the N-source; and a junction gate field effect transistor (JFET) region positioned adjacent the P-well, the JFET region including: a first section formed directly adjacent the P-well, and a second section formed directly adjacent the channel region, the second section positioned between the oxide layer and the first section of the JFET region. In embodiments, the channel region includes a predetermined length between approximately 0.2 microns (μm) and approximately 2.0 μm. In embodiments, the second section defines a width of the JFET region, the width between approximately 0.2 microns (μm) and approximately 5.0 μm. In embodiments, the channel region includes a predetermined doping concentration between approximately $1.0\ 10^{16}$ atoms/$cm^3$ and approximately $9.0\times10^{16}$ atoms/$cm^3$. In embodiments, the first section of the JFET region includes a first doping concentration between approximately $1.0\ 10^{16}$ atoms/$cm^3$ and approximately $9.0\times10^{16}$ atoms/$cm^3$. In embodiments, the second section of the JFET region includes a second doping concentration between approximately $1.0\ 10^{16}$ atoms/$cm^3$ and approximately $9.0\times10^{16}$ atoms/$cm^3$, the second doping concentration of the second section distinct from the first doping concentration of the first section.

In embodiments, the field effect transistor, includes: a substrate; a drift layer disposed over the substrate; a P-well disposed within the drift layer, the P-well including: a first portion disposed directly over the drift layer, the first portion including a plurality of distinct areas, each area including a distinct doping concentration, and a second portion separated from the drift layer by the first portion, the second portion including a second doping concentration distinct from the doping concentrations for each of the distinct areas of the first portion; an N-source disposed at least partially over the second portion of the P-well; an oxide layer disposed over the N-source and the drift layer; and a gate layer disposed over the oxide layer. In embodiments, the second doping concentration of the second portion is greater than the doping concentration of each of the plurality of distinct areas of the first portion.

In another embodiment, similar to that of the fourth embodiment, the second doping concentration of the second portion is between approximately $1.0\times10^{18}$ atoms per cubic cm (atoms/$cm^3$) and approximately $1.5\times10^{19}$ atoms/$cm^3$. In embodiments, the plurality of distinct areas of the first portion of the P-well includes: a first area positioned between the second portion and the drift layer, a second area positioned between the second portion and the first area, a third area positioned between the second portion and the second area, and a fourth area positioned between the second portion and the third area. In embodiments, the doping concentration for each of the first area, the second area, the third area, and the fourth area of the first portion of the P-well is between approximately $1.0\times10^{17}$ atoms per cubic cm (atoms/$cm^3$) and approximately $9.0\times10^{17}$ atoms/$cm^3$. In embodiments, the doping concentration of the first area is less than the doping concentration of the second area, the doping concentration of the second area is less than the doping concentration of the third area, and the doping concentration of the third area is less than the doping concentration of the fourth area. In embodiments, the doping concentration of the fourth area is less than the second doping concentration of the second portion of the P-well. In embodiments, the first area of the first portion of the P-well extends into the drift layer a predetermined depth (D) from the oxide layer. In embodiments, the predetermined depth (D) is between approximately 1.0 microns (μm) and approximately 2.5 μm.

In embodiments, the method of forming the field effect transistor, includes: disposing a drift layer over a substrate; doping a portion of the drift layer to form a p-well within drift layer, the p-well including: a first portion disposed directly over the drift layer, the first portion including a first doping concentration, and a second portion separated from the drift layer by the first portion, the second portion including a second doping concentration distinct from the first doping concentration of the first portion; doping a portion of the second portion of the P-well to form an N-source; disposing oxide an oxide layer over the N-source and the drift layer; and disposing a gate layer over the oxide layer. In embodiments, the doping the portion of the drift layer to form the P-well includes: doping the drift layer with a first ion concentration under first operational parameters to form the first portion; and doping the drift layer with a second ion concentration under second operational parameters to form the second portion, the second ion concentration and the second operational parameters distinct from the first ion concentration and the first operational parameters, respectively. In embodiments, the doping the portion of the drift layer to form the P-well includes: penetrating the drift layer a predetermined distance with the first ion concentration under the first operational parameters to form the first portion approximately 1.0 micron (μm) to approximately 2.5 μm from the oxide layer. In embodiments, doping the first layer with the first ion concentration under first operational parameters further includes: channeling implanting the first ion concentration in the drift layer under the first operational parameters to form the first portion. In embodiments, the first operational parameters including at least one of: a predetermined angle (α) relative to a predefined axis of a crystalline lattice for the drift layer, or a predetermined temperature of the drift layer. In embodiments, the predetermined angle (α) is between approximately one degree (1°) and five degrees (5°) and the predetermined temperature is room temperature.

In embodiments, the method of forming the field effect transistor, includes: disposing a drift layer over a substrate; doping a portion of the drift layer to form a p-well within drift layer, the p-well including: a first portion disposed directly over the drift layer, the first portion including a plurality of distinct areas, each area including a distinct doping concentration, and a second portion separated from the drift layer by the first portion, the second portion including a second doping concentration distinct from the doping concentrations for each of the distinct areas of the first portion; doping a portion of the second portion of the P-well to form an N-source; disposing oxide an oxide layer over the N-source and the drift layer; and disposing a gate layer over the oxide layer. In embodiments, the doping the portion of the drift layer to form the P-well includes: doping the drift layer with a first ion concentration under first operational parameters to form a first area in the first portion; doping the drift layer with a second ion concentration under second operational parameters to form a second area in the first portion; doping the drift layer with a third ion concentration under third operational parameters to form a third area in the first portion; and doping the drift layer with a fourth ion concentration under fourth operational parameters to form a fourth area in the first portion. In embodiments, doping the portion of the drift layer to form the P-well includes: doping the drift layer with a fifth ion concentration under fifth operational parameters to form the second portion, the fifth ion concentration and the fifth operational parameters distinct from: the first ion concentration and the first operational parameters, respectively, the second ion concentration and the second operational parameters, respectively, the third ion concentration and the third operational parameters, respectively, and the fourth ion concentration and the fourth operational parameters, respectively. In embodiments, optionally similar to the embodiments above, the doping the portion of the drift layer to form the P-well includes: penetrating the drift layer a predetermined distance with the first ion concentration under the first operational parameters to form the first area of the first portion approximately 1.0 micron (μm) to approximately 2.5 μm from the oxide layer. In embodiments, doping the first layer with the first ion concentration under first operational parameters further includes: channeling implantation of the first ion concentration in the drift layer under the first operational parameters to form the first portion. In embodiments, the first operational parameters including at least one of: a predetermined angle (α) relative to a predefined axis of a crystalline lattice for the drift layer, or a predetermined temperature of the drift layer. In embodiments, the predetermined angle (α) is between approximately one degree (1°) and five degrees (5°) and the predetermined temperature is room temperature.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately" and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A field effect transistor, comprising:

a substrate;

a drift layer disposed over the substrate;

a P-well disposed within the drift layer, the P-well including:

a first portion disposed directly over the drift layer, the first portion having at least one distinct areas, each of the at least one distinct areas further comprising a respective doping concentration, and a second portion separated from the drift layer by the first portion, the second portion including a distinct area that comprises a second doping concentration different from the respective doping concentration of the at least one distinct areas of the first portion, wherein the second doping concentration of the second portion is greater than the respective doping concentration of the at least one distinct areas;

an N-source disposed at least partially over the second portion of the P-well;

an oxide layer disposed over the N-source and the drift layer; and a gate layer disposed over the oxide layer, wherein the drift layer includes a channel region formed between the second portion of the P-well and the oxide layer, adjacent the N-source.

2. The field effect transistor of claim 1, wherein the at least one distinct area of the first portion of the P-well include:

a first distinct area positioned between the second portion of the drift layer, a second distinct area positioned between the second portion and the first distinct area, a third distinct area positioned between the second portion and the second distinct area, and a fourth distinct area positioned between the second portion and the third distinct area.

3. The field effect transistor of claim 1, wherein the doping concentration of a terminal distinct area immediately adjacent to the second portion is less than the second doping concentration of the second portion of the P-well, and wherein a doping concentration for each consecutive intervening distinct area of one or more intervening distinct areas, formed between the terminal distinct area and a first distinct area, is decreased with respect to an immediately preceding distinct area with the first distinct area having the lowest doping concentration, wherein a fourth distinct area comprises a terminal distinct area, the doping concentration of the fourth distinct area is less than the second doping concentration of the second portion of the P-well with a third, a second and the first distinct area each having a doping concentration lower than the immediately preceding distinct area.

4. The field effect transistor of claim 1, wherein the second doping concentration of the second portion is between approximately $1.0\times10^{18}$ atoms per cubic cm (atoms/$cm^3$) and approximately $1.5\times10^{19}$ atoms/$cm^3$.

5. The field effect transistor of claim 1, wherein the doping concentration for each of the at least one distinct areas of the first portion of the P-well is between approximately $1.0\times10^{17}$ atoms per cubic cm (atoms/$cm^3$) and approximately $9.0\times10^{17}$ atoms/$cm^3$.

6. The field effect transistor of claim 1, wherein the first portion of the P-well extends into the drift layer a predetermined depth (D) from the oxide layer.

7. The field effect transistor of claim 6, wherein the predetermined depth (D) is between approximately 1.0 microns (μm) and approximately 2.5 μm.

8. The field effect transistor of claim 1, wherein the drift layer includes:

a junction gate field effect transistor (JFET) region positioned adjacent the P-well, the JFET region including:

a first section formed directly adjacent the P-well, and a second section formed directly adjacent the channel region, the second section positioned between the oxide layer and the first section of the JFET region.

9. The field effect transistor of claim 8, wherein the channel region includes a predetermined length between approximately 0.2 microns (μm) and approximately 2.0 μm.

10. The field effect transistor of claim 8, wherein the second section defines a width of the JFET region, wherein that width is between approximately 0.2 microns (μm) and approximately 5.0 μm.

11. The field effect transistor of claim 8, wherein the channel region includes a predetermined doping concentration between approximately $1.0\times10^{16}$ atoms/$cm^3$ and approximately $9.0\times10^{16}$ atoms/$cm^3$, wherein the first section of the JFET region includes a first doping concentration between approximately $1.0\times10^{16}$ atoms/$cm^3$ and approximately $9.0\times10^{16}$ atoms/$cm^3$ wherein the second section of the JFET region includes a second doping concentration between approximately $1.0\times10^{16}$ atoms/$cm^3$ and approximately $9.0\times10^{16}$ atoms/$cm^3$, the second doping concentration of the second section distinct from the first doping concentration of the first section.

12. The field effect transistor of claim 1, wherein the channel region is formed as an accumulation channel.

13. The field effect transistor of claim 1, wherein a doping concentration of the channel region is different from the second doping concentration of the second portion of the P-well.

14. The field effect transistor of claim 1, wherein the channel region is defined between an upper surface of the P-well and a lower surface of the oxide layer.

15. A method of forming a field effect transistor, the method comprising:

disposing a drift layer over a substrate;

doping a portion of the drift layer to form P-well within the drift layer, the P-well including:

a first portion disposed directly over the drift layer, the first portion having at least one distinct area, each of the at least one distinct areas further comprising a respective doping concentration, and a second portion separated from the drift layer by the first portion, the second portion including a second doping concentration distinct from the respective doping concentration of the at least one distinct areas of the first portion, wherein the second doping concentration of the second portion is greater than the respective doping concentration of the at least one distinct areas;

doping a portion of the second portion of the P-well to form an N-source;

disposing an oxide layer over the N-source and the drift layer; and disposing a gate layer over the oxide layer, wherein the drift layer includes a channel region formed between the second portion of the P-well and the oxide layer, adjacent the N-source.

16. The method of claim 15, wherein doping a portion of the drift layer further includes:

performing channeling implantation at a first ion concentration under a first operational parameter to form the first portion of the P-well; and performing channeling implantation at a second ion concentration under a second operational parameter to form the second portion of the P-well.

17. The method of claim 15, wherein doping a portion of the drift layer further includes:

performing channeling implantation at a first ion concentration under a first operational parameter to form a first distinct area of the first portion of the P-well;

performing channeling implantation at a second ion concentration under a second operational parameter to form a second distinct area of the first portion of the P-well; and performing channeling implantation at intermediate ion concentrations between the first ion concentration and a final ion concentration under intermediate operational parameters to form any intervening distinct areas between the second distinct area, of the first portion of the P-well, and the second portion of the P-well.

18. The method of claim 15, wherein doping the portion of the drift layer to form the P-well comprises implanting ions using channeling implantation.

19. The method of claim 15, wherein doping the portion of the drift layer to form the P-well comprises implanting ions using channeling implantation, wherein the channeling implantation is performed by implanting ions into a substantially planar upper surface of the drift layer.

20. The method of claim 15, wherein doping the portion of the drift layer to form the P-well comprises implanting ions using channeling implantation, wherein the channeling implantation enables the implanted ions to penetrate the drift layer to a predetermined distance from an upper surface of the drift layer.

* * * * *